United States Patent
Chen et al.

(10) Patent No.: US 7,800,942 B2
(45) Date of Patent: Sep. 21, 2010

(54) METHOD AND SYSTEM FOR PROVIDING A MAGNETIC ELEMENT AND MAGNETIC MEMORY BEING UNIDIRECTIONAL WRITING ENABLED

(75) Inventors: Eugene Chen, Fremont, CA (US);
Dmytro Apalkov, Milpitas, CA (US)

(73) Assignees: Grandis, Inc., Milpitas, CA (US);
Renesas Technology Corp., Tokyo (JP)

( * ) Notice: Subject to any disclaimer, the term of this patent is extended or adjusted under 35 U.S.C. 154(b) by 85 days.

(21) Appl. No.: 12/136,916

(22) Filed: Jun. 11, 2008

(65) Prior Publication Data
US 2008/0310219 A1    Dec. 18, 2008

Related U.S. Application Data

(60) Provisional application No. 60/943,544, filed on Jun. 12, 2007.

(51) Int. Cl.
*G11C 11/15* (2006.01)

(52) U.S. Cl. .................. 365/173; 365/171; 365/158

(58) Field of Classification Search ............... 365/173, 365/171, 158, 55, 209; 360/324.1, 324.12, 360/324.2
See application file for complete search history.

(56) References Cited

U.S. PATENT DOCUMENTS

| | | | |
|---|---|---|---|
| 5,459,701 A | 10/1995 | Tokita et al. | |
| 5,695,864 A | 12/1997 | Slonczewski | |
| 5,757,695 A | 5/1998 | Shi et al. | |
| 6,005,800 A | 12/1999 | Koch et al. | |
| 6,104,633 A | 8/2000 | Abraham et al. | |
| 6,114,719 A | 9/2000 | Dill et al. | |
| 6,136,616 A | 10/2000 | Fulford et al. | |
| 6,205,053 B1 | 3/2001 | Anthony | |
| 6,256,223 B1 | 7/2001 | Sun | |
| 6,532,164 B2 | 3/2003 | Redon et al. | |
| 6,714,444 B2 | 3/2004 | Huai et al. | |
| 6,798,691 B1 | 9/2004 | Ounadjela et al. | |
| 6,967,863 B2 | 11/2005 | Huai | |
| 7,106,624 B2 | 9/2006 | Huai et al. | |
| 7,190,611 B2 | 3/2007 | Nguyen et al. | |
| 7,266,012 B2* | 9/2007 | Saito et al. | ............ 365/158 |
| 7,440,314 B2* | 10/2008 | Sakimura et al. | ............ 365/158 |

(Continued)

OTHER PUBLICATIONS

J.C. Slonczewski, "Current-driven excitation of magnetic multilayers", Journal of Magnetism and Magnetic Materials 159, 1996, pp. L1-L7.

(Continued)

*Primary Examiner*—David Lam
(74) *Attorney, Agent, or Firm*—Convergent Law Group LLP

(57) ABSTRACT

A method and system for providing a magnetic element and memory utilizing the magnetic element are described. The magnetic element includes a reference layer, a nonferromagnetic spacer layer, and a free layer. The reference layer has a resettable magnetization that is set in a selected direction by a magnetic field generated externally to the reference layer. The reference layer is also magnetically thermally unstable at an operating temperature range and has $K_u V/k_B T$ is less than fifty five. The spacer layer resides between the reference layer and the free layer. In addition, the magnetic element is configured to allow the free layer to be switched to each of a plurality of states when a write current is passed through the magnetic element.

30 Claims, 11 Drawing Sheets

U.S. PATENT DOCUMENTS

| | | | |
|---|---|---|---|
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2006/0132990 | A1 | 6/2006 | Morise et al. |
| 2007/0019337 | A1* | 1/2007 | Apalkov et al. .......... 360/324.1 |
| 2007/0019377 | A1 | 1/2007 | Apalkov et al. |

OTHER PUBLICATIONS

L. Berger, "Emission of spin waves by a magnetic multilayer traversed by a current", Physical Review B, vol. 54, No. 13, Oct. 1, 1996, pp. 9353-9358.

J.A. Katine, et al., "Current-Driven Magnetization Reversal and Spin-Wave Excitations in Co/Cu/Co Pillars", Physical Review Letters, vol. 84, No. 14, Apr. 3, 2000, pp. 3149-3152.

F.J. Albert, et al., "Spin-polarized current switching of a Co thin film nanomagnet", Applied Physics Letters, vol. 77, No. 23, Dec. 4, 2000, pp. 3809-3811.

M. Tsoi, et al., "Excitation of a Magnetic Multilayer by an Electric Current", Physical Review Letters, vol. 80, No. 19, May 11, 1998, 4281-4284.

J. Grollier, et al., "Spin-polarized current induced switching in Co/Cu/Co pillars", Applied Physics Letters, vol. 78, No. 23, Jun. 4, 2002, pp. 3663-3665.

J.Z. Sun, et al, "Batch-fabricated spin-injection magnetic switches", Applied Physics Letters, vol. 81, No. 12, Sep. 16, 2002, pp. 2202-2204.

M. R. Pufall, et al., "Materials dependence of the spin-momentum transfer efficiency and critical current in ferromagnetic metal/Cu multilayers", Applied Physics Letters, vol. 83, No. 2, Jul. 14, 2003, pp. 323-325.

S. Urazhdin, et al., "Effect of antiferromagnetic interlayer coupling on current-assisted magnetization switching", Applied Physics Letters, vol. 83, No. 1, Jul. 7, 2003, pp. 114-116.

F.B. Mancoff, et al., "Angular dependence of spin-transfer switching in a magnetic nanostructure", Applied Physics Letters, vol. 83, No. 8, Aug. 25, 2003, pp. 1596-1598.

Y. Jiang, et al.,"Substantial reduction of critical current for magnetization switching in an exchange-biased spin valve", Nature Materials, vol. 3, May 9, 2004, pp. 361-364.

B. Ozyilmaz et al., "Bi-polar high-field excitations in Co/Cu/Co nanopillars", Physical Review B 71, 2005, pp. 1-4.

Yiming Huai, et al., "Observation of Spin-Transfer Switching in Deep Submicron-Sized and Low-Resistance Magnetic Tunnel Junctions", Applied Physics Letters 84, 3118, 2004, pp. 1-3.

Zhitao Diao, et al., "Spin transfer switching and spin polarization in magnetic tunnel junctions with MgO and AlOx barriers", Applied Physics Letters 87, 232502, 2005, pp. 1-3.

M. Hosomi, et al., "A Novel Nonvolatile Memory with Spin Torque Transfer Magnetization Switching: Spin-RAM", IEDM Technical Digest, 473, 2005, pp. 1-4.

T. Yamamoto, et al., "Magnetoresistive random access memory operation error by thermally activated reversal (invited)", Journal of Applied Physics 97, 2005, pp. 1-6.

Saied Tehrani, "Status and Outlook of MRAM Memory Technology (Invited)", IEDM Technical Digest, 2006, pp. 585-588.

John DeBrosse, "Circuit Considerations for Spin-Switched MRAM Devices", Cornell CNS Nanotechnology Symposium, May 14, 2004, pp. 1-15 http://www.cns.cornell.edu/documents/JohnDeBrosseCNSSymp504.pdf.

J. H. Oh, et al., "Full Integration of Highly Manufacturable 512Mb PRAM based on 90nm Technology", IEDM Technical Digest, 2006, pp. 49-52.

Kwang-Jin Lee, et al., "A 90nm 1.8v 512Mb Diode-Switch PRAM with 266MB/s Read Throughput", IEEE International Solid-State Circuits Conference Digest of Technical Papers, 2007, pp. 472-473.

Hirofumi Morise, et al., "Stable magnetization states under a spin-polarized current and a magnetic field", Physical Review B71, 2005, pp. 1-6.

Jun Hayakawa, et al., "Current-Driven Magnetization Switching in CoFeB/MgO/CoFeB Magnetic Tunnel Junctions", Japanese Journal of Applied Physics, vol. 44, No. 41, 2005, pp. L1267-L1270.

PCT International Search Report and Written Opinion of the International Searching Authority, issued Sep. 12, 2008, application No. PCT/US08/66369.

E.G. Myers, et al., "Point-contact studies of current-controlled domain switching in magnetic multilayers", Journal of Applied Physics, vol. 87, No. 9, May 1, 2000, pp. 5502-5504.

J.C. Slonczewski, "Conductance and exchange coupling of two ferromagnets separated by a tunneling barrier", Physical Review B, vol. 39, No. 10, Apr. 1, 1989, pp. 6995-7002.

J. Z. Sun, "Current-driven magnetic switching in manganite trilayer junctions", Journal of Magnetism and Magnetic Materials, 202, 1999, pp. 157-162.

Daughton, et al., Patent Publication US2003/0007398 dated Jan. 9, 2003 Figures 3, 4, 5A; Paragraphs 60, 61, 67, 68.

J. Slonczewski, "Theory and Application of Exchange-Driven Switching", IEEE, April 2000, pp. CE-02.

James Daughton, Magnetoresistive Random Access Memory (MRAM), Copyright Feb. 4, 2000, pp. 1-13.

Desmond J. Mapps, et al., "A Non-Volatile Solid-State Memory using the Magnetic Spin-Dependent-Tunnelling Effect", Datatech, pp. 25-28.

Susumu Soeya, et al., "Development of half-metallic ultrathin Fe3O4 films for spin-transport devices", Applied Physics Letters, vol. 80, No. 5, Feb. 4, 2002, p. 823-825.

PCT International Search Report and Written Opinion of the International Searching Authority, issued Sep. 5, 2008, application No. PCT/US08/64794.

J. Z. Sun, "Spin-current interaction with a monodomain magnetic body: A model study", Physical Review B, vol. 62, No. 12, Jul. 1, 2000, pp. 570-578.

Jiang, et al., "Bias voltage dependence of magnetocurrent in magnetic tunnel transistors", Physical Review B 69, 2004, pp. 1-6.

* cited by examiner

METHOD AND SYSTEM FOR PROVIDING A MAGNETIC ELEMENT AND MAGNETIC MEMORY BEING UNIDIRECTIONAL WRITING ENABLED

CROSS-REFERENCE TO RELATED APPLICATIONS

The present application claims priority from co-pending provisional patent application Ser. No. 60/943,544, filed Jun. 12, 2007, entitled "Unidirectional Writing Enabled Scalable High Density Nonvolatile STT-RAM".

BACKGROUND OF THE INVENTION

Current mainstream semiconductor memories in both embedded and standalone applications include static random access memory (SRAM), dynamic random access memory (DRAM), and nonvolatile Flash memories (NAND and NOR). SRAM is fast, but large and volatile. DRAM is small, has medium speed, but is volatile. Consequently, DRAM requires a refresh to retain the data stored in the memory. Flash memory is the smallest, has a medium speed and nonvolatile.

Magnetic memories, particularly magnetic random access memories (MRAMs) have drawn increasing interest as alternatives to semiconductor memories. Magnetic memories have their potential for high read/write speed, excellent endurance, non-volatility and low power consumption during operation. An MRAM can store information utilizing magnetic materials as an information recording medium. Typically, a conventional magnetic element is used for storing data in such magnetic memories.

FIG. 1 depicts a conventional magnetic element 10, which may be a conventional magnetic tunneling junction (MTJ) or a conventional spin valve. The conventional magnetic element 10 may be used in a conventional magnetic memory. In memory applications, the conventional magnetic element 10 is typically a conventional MTJ. The conventional MTJ 10 typically resides on a substrate (not shown), uses seed layer(s) 11 and includes a conventional antiferromagnetic (AFM) layer 12, a conventional reference layer 14, a conventional barrier layer 16, a conventional free layer 18, and a conventional capping layer 20.

The spacer layer 16 is nonmagnetic. The spacer layer 16 may be a tunneling barrier layer, for example a thin insulator, or a conductor. If the spacer layer 16 is a barrier layer, then the conventional magnetic element 10 is a MTJ. If, however, the conventional spacer layer 16 is conductive, then the conventional magnetic element is a spin valve. The conventional capping layer 20 is typically used to provide protection for the underlying layers 11, 12, 14, 16, and 18. The conventional seed layer(s) 11 are typically utilized to aid in the growth of subsequent layers, such as the antiferromagnetic layer 12, having a desired crystal structure.

The conventional reference layer 14 and the conventional free layer 18 are ferromagnetic. Typically, materials containing Fe, Ni, and/or Co such as FeCo, FeCoB, Permalloy, Co, are used in the conventional reference layer 14 and the conventional free layer 18. The conventional free layer 18 has a changeable magnetization 19 and may have an easy axis established by shape anisotropy and/or crystalline anisotropy in plane or crystalline anisotropy out-of-plane. The easy axis of the conventional free layer 18 is typically such that the free layer magnetization 19 is parallel (P state) or antiparallel (AP state) with the magnetization 15 of the conventional reference layer 14. In contrast to the conventional free layer 18, the magnetization 15 of the conventional reference layer 14 is stable throughout use of the magnetic element 10. For example, the magnetization 15 would be stable at room and operating temperatures. The magnetization 15 of the conventional reference layer 14 is fixed, or pinned, in a particular direction, typically by an exchange-bias interaction with the AFM layer 12. Although depicted as simple (single) layers, the reference layer 14 and free layer 18 may include multiple layers. For example, the reference layer 14 and/or the free layer 18 may be a synthetic layer including ferromagnetic layers antiferromagnetically or ferromagnetically coupled through a thin conductive layer, such as Ru. In such a synthetic layer, multiple layers of CoFeB interleaved with a thin layer of Ru may be used for the conventional reference layer 14 and/or the conventional free layer 18. Further, other versions of the conventional magnetic element 10 might include an additional reference layer (not shown) separated from the free layer 18 by an additional nonmagnetic barrier or conductive layer (not shown).

Data, such as a logical "1" or "0", typically corresponds to the magnetization 19 of the free layer 18 being in the P state or the AP state, respectively. Thus, data are written by setting the free layer 18 in the P state or the AP state. For some conventional magnetic elements 10, this is accomplished by applying an external magnetic field, for example using one or more current-carrying lines.

FIG. 2 depicts a portion of a conventional magnetic memory 30 that utilizes a magnetic field to write data. The conventional magnetic memory 30 utilizes the conventional magnetic element 10 depicted in FIG. 1 in order to store data. Referring to FIGS. 1 and 2, in the magnetic memory 30, the conventional magnetic element 10 is represented as a resistance. The conventional magnetic memory 30 includes a magnetic storage cell including the conventional magnetic element 10 and a selection transistor 34. The selection transistor 34 is typically an NMOS device, but may also be a PMOS device. Also shown are bit line 36, word line 38, source line 40 and write word line 42. In order to write to the conventional magnetic element, a current is driven through the bit line 36 and the write word line 42. Typically, the conventional magnetic element 10 resides at cross points of the bit line 36 and write word line 42. When write currents are driven through both lines 36 and 42, the magnetic field at the conventional magnetic element 10 is sufficient to change the magnetization 19 of the free layer 18. Thus, data may be written to the conventional magnetic element 10. In order to read the data from the conventional storage cell 32, the word line 38 is activated to turn on the selection transistor 34. A read current is driven between the bit line 36 and the source line 40. The resistance of the conventional magnetic element 10 can be ascertained and, therefore, the state of the conventional magnetic element 10 determined.

In certain situations, the conventional magnetic element 10 may also be written using the spin transfer torque. In general, the spin transfer torque may be used for magnetic elements having lateral dimensions on the order of a few hundred nanometers or less. In spin transfer torque switching, a spin polarized conduction current is used directly to switch the magnetization of the conventional magnetic element 10. FIG. 3 depicts a portion of a conventional magnetic memory 30' that may be switched using spin transfer torque. Portions of the conventional magnetic memory 30' are analogous to the conventional magnetic memory 30 and are, therefore, labeled similarly. The conventional magnetic memory 30' utilizes the conventional magnetic element 10 depicted in FIG. 1 in order to store data. Referring to FIGS. 1 and 3, in the magnetic memory 30', the conventional magnetic element 10 is represented as a resistance. The conventional magnetic memory 30' includes a magnetic storage cell 32' including the conventional magnetic element 10 and a selection transistor 34'. Also shown are bit line 36', word line 38', and source line 40'.

In order to write to the conventional magnetic element, the word line 38' is activated to allow current to be driven through the magnetic element 10 and the selection transistor 34'. The write current is bidirectional in nature. Current driven from the bit line 36' to the source line 40' sets the magnetization direction of the free layer 18 in a first direction. For reverse writing, current is driven in the opposite direction (from the source line 40' to the bit line 36' and sets the magnetization 19 of the free layer 18 in the opposite direction. Thus, data may be written to the conventional magnetic element 10 using bidirectional write currents. In order to read the data from the conventional storage cell 32', the word line 38' is activated to turn on the selection transistor 34'. A read current is driven through the bit line 36', the conventional magnetic element 10 and selection transistor 34'. The resistance of the conventional magnetic element 10 can be ascertained and, therefore, the state of the conventional magnetic element 10 determined.

Use of the conventional magnetic memory 30' and spin transfer torque may allow a lower write current to be used than the conventional magnetic memory 30. In particular, the spin transfer torque depends upon the current density through the conventional magnetic element 10. As the conventional magnetic element 10 decreases in size, the current through the magnetic element can decrease in size while maintaining a sufficient current density for spin transfer torque switching. Consequently, a spin transfer torque-based memory, such as the conventional memory 30' may be scalable to higher densities.

Although the memory 30' functions, one of ordinary skill in the art will recognize that the current through the magnetic storage cell 32' is not the same for writing to either state. FIG. 4 depicts another conventional memory 30" that uses spin transfer torque switching and which has greater current available for reverse writing. Portions of the conventional magnetic memory 30" are analogous to the conventional magnetic memories 30/30' and are, therefore, labeled similarly. The conventional magnetic memory 30" utilizes the conventional magnetic element 10 depicted in FIG. 1 in order to store data. Referring to FIGS. 1 and 4, in the magnetic memory 30", the conventional magnetic element 10 is represented as a resistance. The conventional magnetic memory 30" includes a magnetic storage cell 32" including the conventional magnetic element 10. However, the conventional magnetic storage cell 32" includes two selection transistors 34A and 34B. One of the selection transistors 34A is an NMOS transistor, while the other selection transistor 34B is a PMOS transistor. The pair of selection transistors 34A and 34B are used to aid in providing a larger reverse write current (from the magnetic element 10 to the bit line 36"). Also shown are bit line 36", word lines 38A and 38B, and source line 40". In order to write to the conventional magnetic element 10, current is driven either from the bit line 36" to the source line 40" or vice versa.

Although the memories 30' and 30" may use lower write current than the conventional magnetic memory 30, one of ordinary skill in the art will recognize that there are drawbacks to scaling the memories 30' and 30" to higher densities. For example, it is desired for the magnetic memories 30' and 30", it is desirable for the magnetic memory to have the potential to be dense ($\sim 10 \text{ F}^2$), fast (sub 10 ns read and write), and operate at low power. Thus, it may be desirable to for the memories 30' and 30" to be able to or have the potential to function at CMOS logic nodes such as 65 nm, and show a clear potential for future nodes such as 45 nm, 32 nm and beyond. The memories 30' and 30" may face issues in achieving these goals.

For the magnetic memory 30', the current available for writing not symmetric for forward and reverse writing. The magnetic memory 30" has more symmetric write currents. However, because of the inclusion of two transistors 34A and 34B and the use of a larger PMOS transistor as one of the transistors 34A and 34B, the size of the magnetic storage cell 32" may be significantly larger. For the conventional magnetic element 10 in the memories 30'/30", thermal stability of the magnetization 19 for the conventional free layer 18 may be provided by shape anisotropy. However, this thermal stability is related to the critical current density (current density required to switch the magnetization direction using spin transfer torque). For a conventional magnetic element 10 having a sufficient thermal stability factor ($K_u V/k_B T$), believed to be approximately fifty-five, the critical current density may be large. A high voltage and current for a sufficient current density that may be required for thermally stable writing of the conventional magnetic element 10 at higher densities may be difficult to achieve for the magnetic storage cell 32'. Thus, there may be limitations to scaling conventional spin transfer torque based memories 30' and 30" to higher densities.

Another type of memory that has been developed is phase change based memory. Phase change memories utilize a current to heat a phase change material. Based upon the pulse used, the phase change material may be toggled between phases. For example, heating induced by a current pulse may change an amorphous insulator phase to a crystalline conductor phase. A higher current pulse having a shorter duration may be used to reset the memory to the amorphous insulator phase. Further, because heating is used, the direction of current is apparently unimportant to the phase change material. As a result, phase change memory may utilize smaller components, such as transistors or diodes, that accommodate unidirectional current. Although phase change memories may be made smaller, one of ordinary skill in the art will recognize that phase change memories are relatively slow in comparison to conventional spin transfer torque based memories 30' and 30".

Accordingly, what is needed is a method and system that may improve the ability of the spin transfer torque based memories to be scaled to higher densities. The method and system address such a need.

BRIEF SUMMARY OF THE INVENTION

A method and system for providing a magnetic element and memory utilizing the magnetic element are described. The magnetic element includes a reference layer, a nonferromagnetic spacer layer, and a free layer. The reference layer has a resettable magnetization that is set in a selected direction by a magnetic field generated externally to the reference layer. The reference layer is also magnetically thermally unstable at an operating temperature and has $K_u V/k_B T$ is less than fifty five. The spacer layer resides between the reference layer and the free layer. In addition, the magnetic element is configured to allow the free layer to be switched to each of a plurality of states when a write current is passed through the magnetic element.

According to the method and system disclosed herein, a magnetic memory that may be written using a unidirectional write current and may be scaled to higher densities may be achieved.

DETAILED DESCRIPTION OF THE INVENTION

Figure 1:
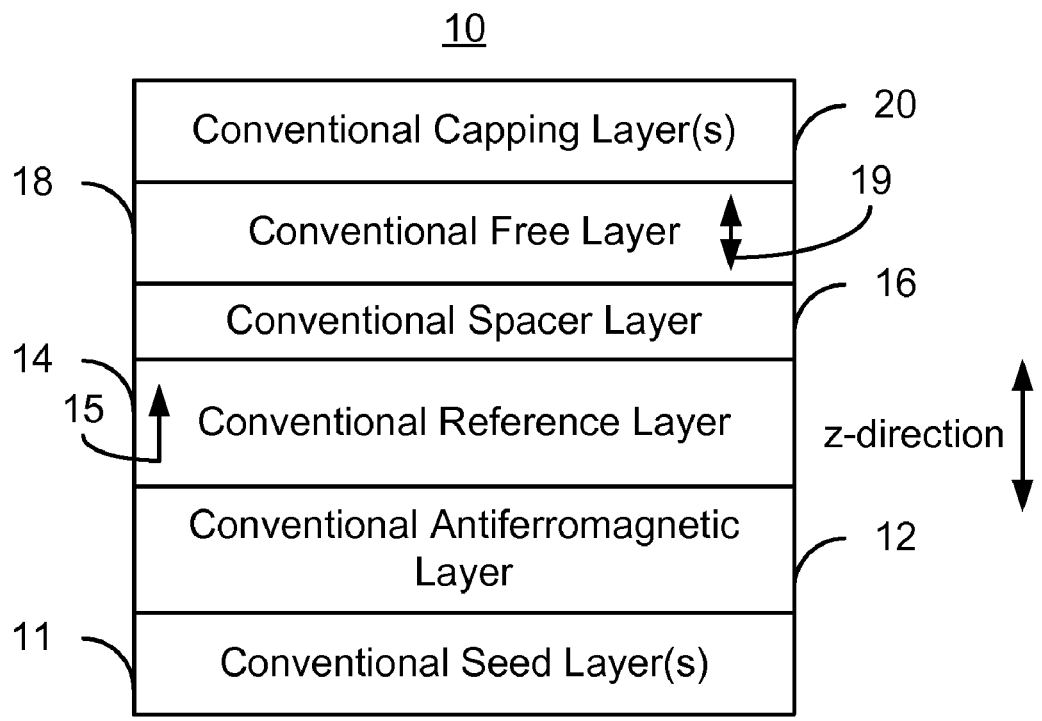
FIG. 1 is a diagram of a conventional magnetic element.
Figure 2:
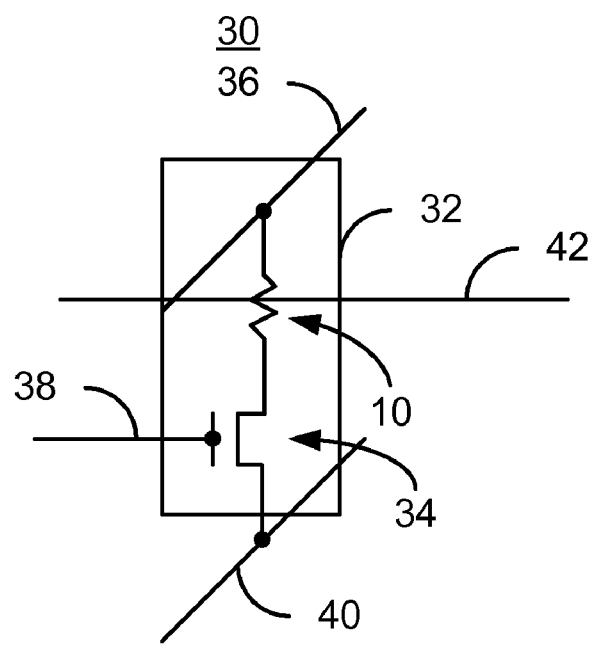
FIG. 2 is a diagram depicting a portion of a conventional magnetic memory utilizing magnetic field based switching.
Figure 3:
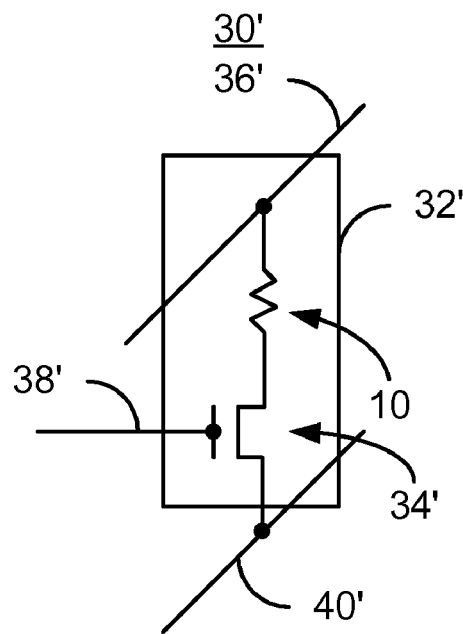
FIG. 3 is a diagram depicting a portion of a conventional magnetic memory using spin transfer torque switching.
Figure 4:
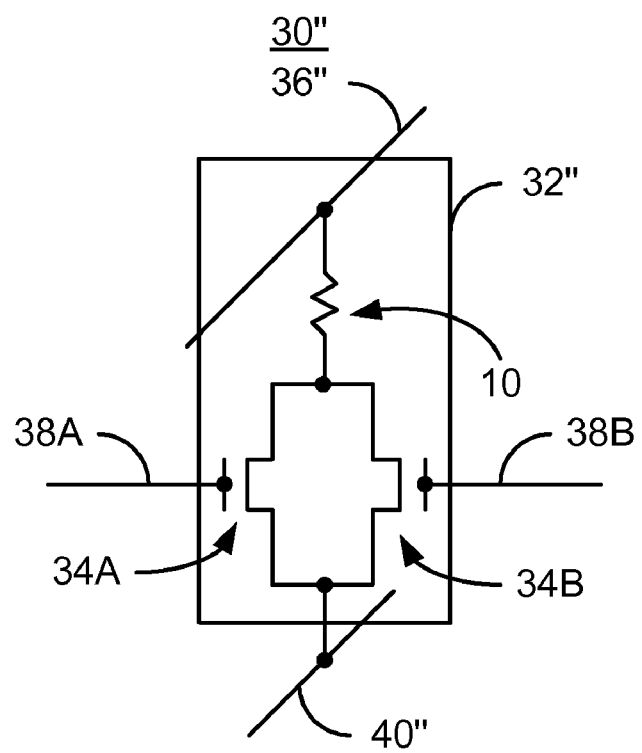
FIG. 4 is a diagram depicting a portion of a conventional magnetic memory using spin transfer torque switching.

The method and system relate to magnetic memories. The following description is presented to enable one of ordinary skill in the art to make and use the method and system and is provided in the context of a patent application and its requirements. Various modifications to the embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a magnetic element and memory utilizing the magnetic element are described. The magnetic element includes a reference layer, a nonferromagnetic spacer layer, and a free layer. The reference layer has a resettable magnetization that is set in a selected direction by a magnetic field generated externally to the reference layer. The reference layer is also magnetically thermally unstable at room temperature. The spacer layer resides between the reference layer and the free layer. In addition, the magnetic element is configured to allow the free layer to be switched to each of a plurality of states when a write current is passed through the magnetic element.

The method and system are described in the context of particular magnetic elements and magnetic memories having certain components. One of ordinary skill in the art will readily recognize that the present invention is consistent with the use of magnetic elements and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the resettable reference layer is depicted on the bottom of a magnetic element. In other embodiments, the reference layer might be at the top of the magnetic element. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements, bit lines, and word lines.

Figure 5A:
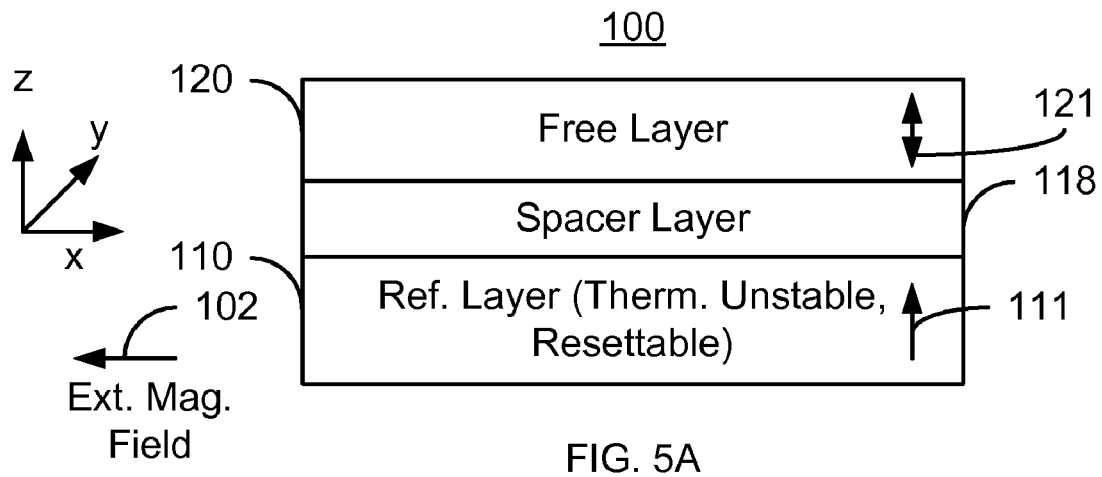
FIGS. 5A-5C are diagrams depicting an exemplary embodiment of a magnetic element switchable with a unidirectional current.
Figure 5B:
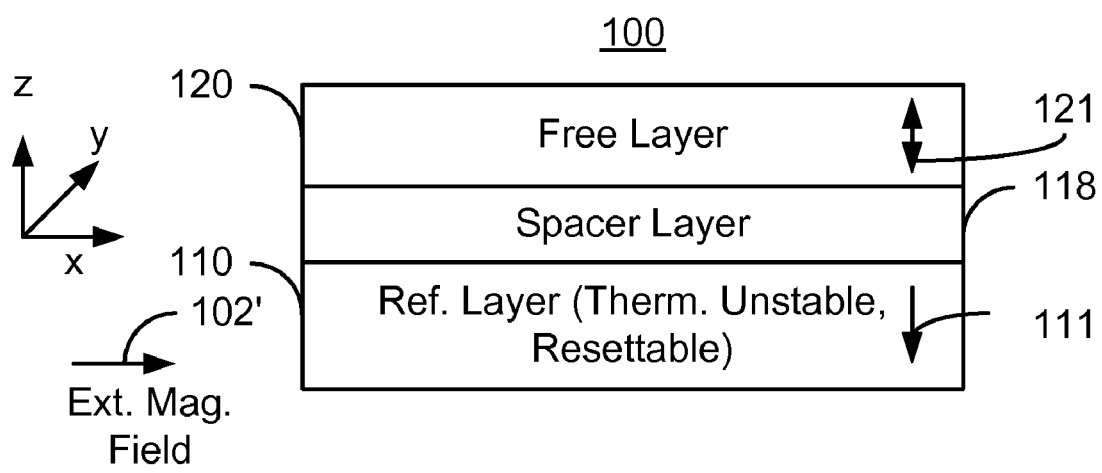
Figure 5C:
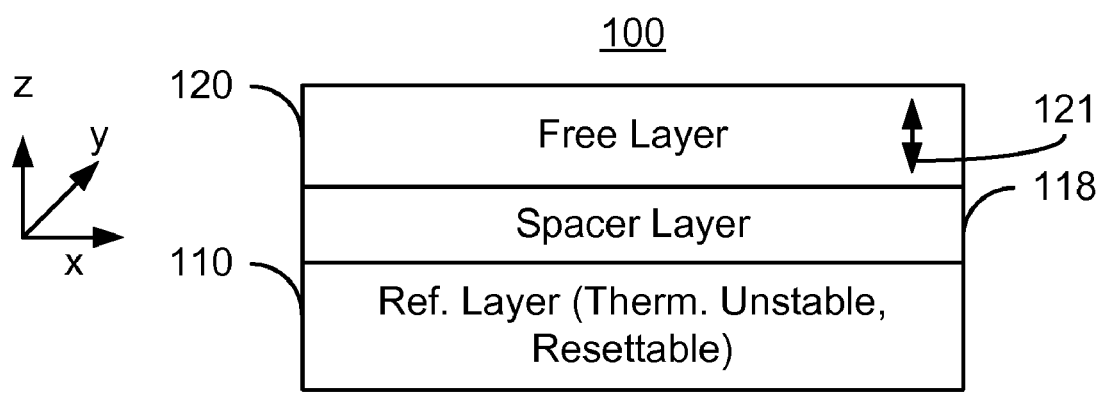

FIGS. 5A-5C are diagrams depicting an exemplary embodiment of a magnetic element 100 switchable with a unidirectional current. The magnetic element 100 includes a reference layer 110, a spacer layer 118, and a free layer 120. In addition, seed layer(s) (not shown) and capping layer(s) (not shown) may also be used. For clarity, the magnetizations depicted in FIGS. 5A-5C are out-of-plane. However, in another embodiment, the magnetizations could have a component and/or be completely in-plane.

The free layer 120 is ferromagnetic and includes at least one of Co, Ni, and Fe. The free layer 120 has a magnetization 121 that is thermally stable. Stated differently, once the magnetization 121 of the free layer 120 is written (set to a particular state/direction) the magnetization 121 of the free layer 120 remains substantially in that direction. In one embodiment, the thermal constant ($K_u V/k_B T$) for the thermally stable free layer is at least approximately fifty five. Stated differently, as used herein, "thermally unstable" corresponds to the thermal constant ($K_uV/k_BT$) being less than fifty five. As used herein, thermally unstable state is also superparamagnetic. Although depicted as a simple layer, the free layer 120 may be a synthetic layer including multiple (e.g. two or more) ferromagnetic layers separated by nonmagnetic spacer layer(s), such as Ru. In such an embodiment, the ferromagnetic layers may be antiferromagnetically coupled. Use of a synthetic free layer may enhance thermal stability without substantially increasing the spin transfer torque switching current density. The equilibrium position(s) of the magnetization 121 of the free layer 120 may be along an easy axis (not separately shown in FIGS. 5A-5C). The magnetic element 100 is also configured such that the magnetization 121 of the free layer 120 may be switched when a write current is passed through the magnetic element. Thus, the magnetic element 100 is configured such that spin transfer torque may be used in switching the magnetization 121 of the free layer. As a result, the lateral dimensions of the magnetic element 100 are preferably less than two hundred nanometers. In one embodiment, the lateral dimensions of the magnetic element 100 may be on the order of ninety nanometers or less.

The spacer layer 118 is nonmagnetic. In one embodiment, the spacer layer 118 is a barrier layer, for example an insulating tunneling barrier layer. In another embodiment, the spacer layer 118 may be conductive. In an alternate embodiment, the spacer layer might have another structure, for example a granular layer including conductive channels in an insulating matrix.

The magnetization 111 of the reference layer 110 is used to spin polarize the write current when the magnetic element 100 is written. In addition, differences between the direction of magnetizations 111 and 121 of the reference layer 110 and free layer 120, respectively, may be used to read data stored by the magnetic element 100. However, the reference layer 110 is not magnetically thermally stable at room temperature. In the embodiment shown in FIGS. 5A-5C, therefore, the magnetization 121 is not thermally stable at an operating temperature. Thermally unstable is the same as for the free layer the thermal constant ($K_uV/k_BT$) is less than fifty five. In one embodiment, the reference layer 110 is a superparamagnetic layer and/or has a coercivity of not more than approximately twenty Oe. For example, the reference layer 110 may be and/or include a superparamagnetic layer. A superparamagnetic layer would have a single domain and thus be characterized by a single magnetization 111 under a magnetic field. However, this magnetization 111 would not have a single stable direction in the absence of an external field because of thermal instabilities. In another embodiment, the reference layer may have multiple domains, but have a coercivity of not more than approximately twenty Oe. As discussed previously, in conventional memory cells both the free layer and the reference layer are thermally stable. The reference layer is usually pinned, and thus significantly more thermally stable than the free layer. In contrast, the reference layer 110 is thermally unstable. In addition, note that a reference layer having a low switching field or low magnetization does not mean that the reference layer is thermally unstable. The thermal factor is determined by $K_uV$, where $K_u$ is the total anisotropy energy of the reference layer, and V is its volume. Low switching field or low magnetization tends to make a portion (shape anisotropy, e.g.) smaller. However, with large volume, the thermal factor may be larger than fifty five, making the layer thermally stable. Even a circular shaped magnetic element which has no shape anisotropy may have a high crystalline anisotropy and thus thermally stable. Thus, although conventional reference layers might have low or no shape anisotropy or crystalline anisotropy, in contrast to the reference layer 110, these conventional reference layers are thermally stable.

The characterstics of the reference layer 10 may be understood more clearly with reference to the magnetic fields depicted. FIGS. 5A-5C. In FIG. 5A, an external magnetic field 102 is applied at least to the reference layer 110. An external magnetic field is a field generated externally to a particular component. Thus, the external magnetic field 102 is generated externally to the reference layer 110. As a result, the magnetization 111 of the reference layer 110 is along the magnetic field 102 (in the −x or +z direction). In FIG. 5B, the external magnetic field 102' is in the opposite direction. Consequently, the magnetization 111 of the references layer 110 is in the opposite direction (in the +x or −z direction). Thus, the magnetization 111 of the reference layer 110 is resettable. Stated differently, the direction of magnetization of the reference layer 110 may be changed during use. In FIG. 5C, there is no external magnetic field. Because it is thermally unstable, the reference layer 110 has no preferred, stable magnetization direction. Consequently, the magnetization 111 is not shown. Unlike a conventional thermally stable magnetic layer in a small element, whose switching field increases as the element becomes smaller, a thermally unstable reference layer retains, its small switching field as the element becomes smaller, for example for future generation memories. The reference layer 110 optionally may also have high damping constant, so that it the reference layer 110 is less responsive to spin transfer torque disturb switching. In one embodiment, the damping constant of the reference layer 110 is greater than the damping constant of the free layer 120. As a result, the free layer 120 may be switched by spin transfer torque writing, while the reference layer 110 remains substantially undisturbed by the spin transfer torque writing.

In operation, an external magnetic field is used in writing and reading the magnetic element 100. If the magnetic element 100 is to be written to a first state (free layer 120 magnetization 121 in the −x or +z direction), then the external magnetic field 102 is generated in the −x or +z direction. In addition, a write current is driven through the magnetic element 100, from the free layer 120 to the reference layer 110. Thus, electrons travel from the reference layer 110 to the tree layer 120. Because the electrons pass through the reference layer 110, the write current becomes spin polarized. As a result, the magnetization 121 of the free layer 120 is set to the −x or +z direction. Thus, in the magnetic element 100 depicted in FIG. 5A, the magnetization 121 would be set in the −x or +z direction. If the magnetic element 100 is to be written to a second state (tree layer 120 magnetization 121 in the x or +z direction), then the external magnetic field 102' is generated in the x or −z direction. In addition, a write current is driven through the magnetic element 100, from the free layer 120 to the reference layer 110. Because electrons pass through the reference layer 110, the write current becomes spin polarized. As a result, the magnetization 121 of the free layer 120 is set to the x or −z direction. Thus, in the magnetic element 100 depicted in FIG. 5B, the magnetization 121 would be set in the x or −z direction. The application period of the magnetic field is desirably as long as or longer than the unidirectional write current pulse.

In order to read the magnetic element 100, an external magnetic field 102 or 102' is generated. In alternate embodiments, either magnetic field 102 or 102' may be used. However, in one embodiment, the external magnetic field has the same direction for all read operations. For clarity a read operation is described in the context of the magnetic field 102 depicted in FIG. 5A. Because of the presence of the magnetic field 102, the magnetization 111 of the reference layer 110 is in the −x or +z direction. A read current is driven through the magnetic element 100. In one embodiment, the read current is less than the write current and is sufficiently small that the magnetization 121 of the tree layer 120 is not switched. Based upon the magnitude of the signal from the magnetic element 100, the direction of the magnetization 121 may be determined. Thus, state of the magnetic element 100 can be determined.

Thus, the magnetic element 100 may be written using a unidirectional current in conjunction with the external magnetic field 102/102'. The external magnetic field 102/102' used may be bidirectional and is used to select which of the states to which the magnetic element 100 is written. Because the magnetic element 100 may be written using a unidirectional current, the size of a storage cell fabricated using the magnetic element may be made smaller. Because of the use of the reference layer 110 having the thermally unstable, resettable magnetizations, a lower current may be used to generate the external magnetic field. This current used in generating the magnetic field may remain low for future even smaller memory cells. The large damping constant of the reference layer makes it less responsive to disturb switching effect from the spin transfer torque. Thus, the magnetic element 100 may be better able to be used in a high density memory.

Figure 6:
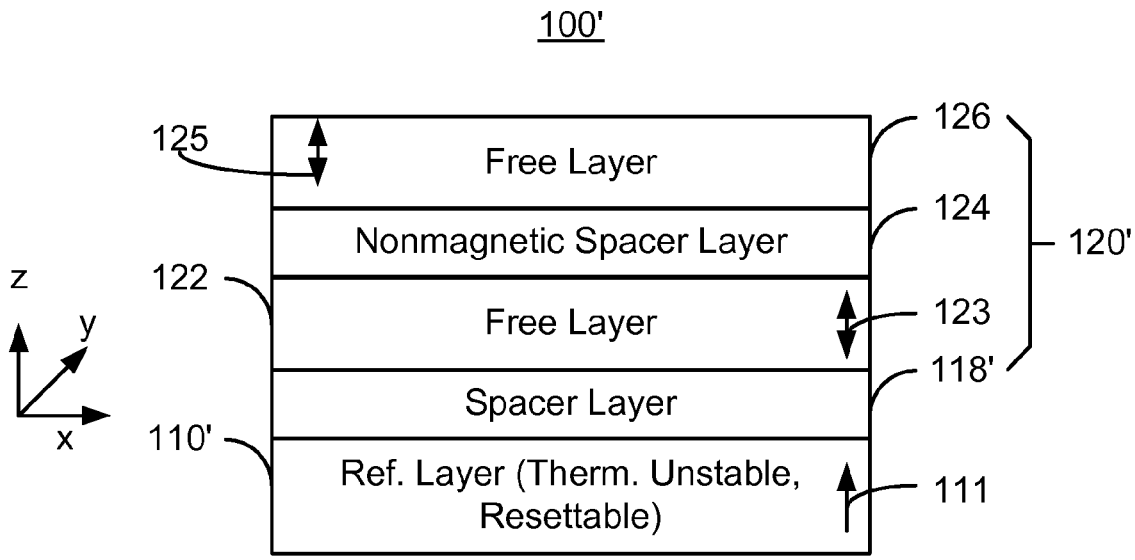
FIG. 6 is a diagram depicting another exemplary embodiment of a magnetic element switchable with a unidirectional current.

FIG. 6 is a diagram depicting another exemplary embodiment of a magnetic element 100' switchable with a unidirectional current. Portions of the magnetic element 100' are analogous to the magnetic element 100 depicted in FIGS. 5A-C. Consequently, portions of the magnetic element 100' are labeled similarly. The magnetic element 100' thus includes a reference layer 110', a spacer layer 118', and a free layer 120'. In addition, seed layer(s) (not shown) and capping layer(s) (not shown) may also be used. For clarity, the magnetizations of layers in the magnetic element 100' are described as being out-of-plane. However, in another embodiment, the magnetizations could have a component and/or be completely in-plane.

The free layer 120' is analogous to the free layer 120. However, the free layer 120' is a synthetic layer including two ferromagnetic layers 122 and 126 separated by a nonmagnetic spacer layer 124, such as Ru. Because the free layer 120' is synthetic, the thermal stability of the free layer 120' may be improved without substantially increasing the spin transfer torque switching current density for the free layer 120'. The use of three layers 122, 124, and 126 may provide a low magnetostatic coupling field. In one embodiment, the magnetostatic field coupling is controlled to reduce or preclude an offset field on the reference layer 110'. In another embodiment, additional ferromagnetic layers (not shown) interleaved with nonmagnetic spacer layers (not shown) may also be used. In one embodiment, the magnetizations 123 and 125 are antiferromagnetically coupled. The equilibrium position (s) of the magnetizations 123 and 125 of the free layer 120' may be along an easy axis (not separately shown in FIG. 6). The magnetic element 100' is also configured such that the magnetizations 123 and/or 125 of the free layer 120' may be switched when a write current is passed through the magnetic element. Thus, the magnetic element 100' is configured such that spin transfer torque may be used in switching the free layer 120'. As a result, the lateral dimensions of the magnetic element 100' are preferably less than two hundred nanometers. In one embodiment, the lateral dimensions of the magnetic element 100' may be on the order of ninety nanometers or less.

The spacer layer 118' is analogous to the spacer layer 118. The spacer layer 118' is, therefore, nonmagnetic and may be a barrier layer such as an insulating tunneling barrier layer. In other embodiments, the spacer layer 118' may be conductive or may have another structure, for example a granular layer including conductive channels in an insulating matrix.

The reference layer 110' is analogous to the reference layer 110. Thus, the reference layer 110' is not magnetically thermally stable at room temperature. Consequently, the magnetization is not shown. In one embodiment, the reference layer 110' is a superparamagnetic layer and/or has a coercivity of not more than approximately twenty Oe. For example the reference layer 110' may be and/or include a superparamagnetic layer. However, the magnetization of the superparamagnetic layer would not have a single stable direction in the absence of an external field because of thermal instabilities. In another embodiment, the reference layer 110' may have multiple domains, but have a coercivity of not more than approximately twenty Oe. In addition, the reference layer 110' is used to spin polarize the write current when the magnetic element 100' is written. In addition, differences between the directions of the magnetization of the reference layer 110 and the magnetization 123 of the free layer 120' may be used to read data stored by the magnetic element 10'. In addition, the reference layer 110' may optionally have high damping constant, so that it is less prone to disturb switching by the spin transfer torque. In one embodiment, the damping constant of the reference layer 110' is greater than the damping constant of the free layer 120'. As a result, the free layer 120' may be switched by spin transfer torque writing, while the reference layer 110' remains substantially undisturbed by the spin transfer torque writing.

The magnetic element 100' operates in an analogous manner to the magnetic element 100. Thus, an external magnetic field (not shown) is used in writing and reading the magnetic element 100'. If the magnetic element 100' is to be written to a first state then the external magnetic field is generated in the −x or +z direction and a write current driven through the magnetic element 100'. Because electrons pass through the reference layer 110', the write current becomes spin polarized. As a result, the magnetization 123 of the ferromagnetic layer 122 of the tree layer 120' is set to the −x or +z direction. It the magnetic element 101 is to be written to a second state, then the external magnetic field is generated in the x or −z direction and a write current is driven through the magnetic element 100' in the same direction. Because, electrons pass through the reference layer 110' the write current becomes spin polarized. As a result, the magnetization 123 of the free layer 120' is set to the x or −z direction. The application period of the magnetic field is desirably as long as or longer than the unidirectional write current pulse.

In order to read the magnetic element 100', an external magnetic field (not shown) that may be in the same direction for all read operations is used. Because of the presence of the magnetic field, the magnetization of the reference layer 110 is in the same direction as the magnetic field. A read current is driven through the magnetic element 100'. In one embodiment, the read current is less than the write current and is sufficiently small that the magnetizations 123 and 125 of the free layer 120' are not switched. Based upon the magnitude of the signal from the magnetic element 100', the directions of the magnetizations 125 and 125 may be determined. Thus, state of the magnetic element 100' can be determined.

Thus, the magnetic element 100' may be written using a unidirectional current in conjunction with the external magnetic field (not shown. The external magnetic field used may be bidirectional and is used to select which of the states to which the magnetic element 100' is written. Because of the use of the reference layer 110' having the thermally unstable, resettable magnetizations, a lower current may be used to generate the external magnetic field. This current may remain low for future even smaller memory cells. Because the magnetic element 100 may be written using a unidirectional current, the size of a storage cell fabricated using the magnetic element may be made smaller. Thus, the magnetic element 100' may be better able to be used in a high density memory. Furthermore, the thermal stability of the magnetic element 100' may be enhanced by the use of a synthetic free layer 120'.

Figure 7:
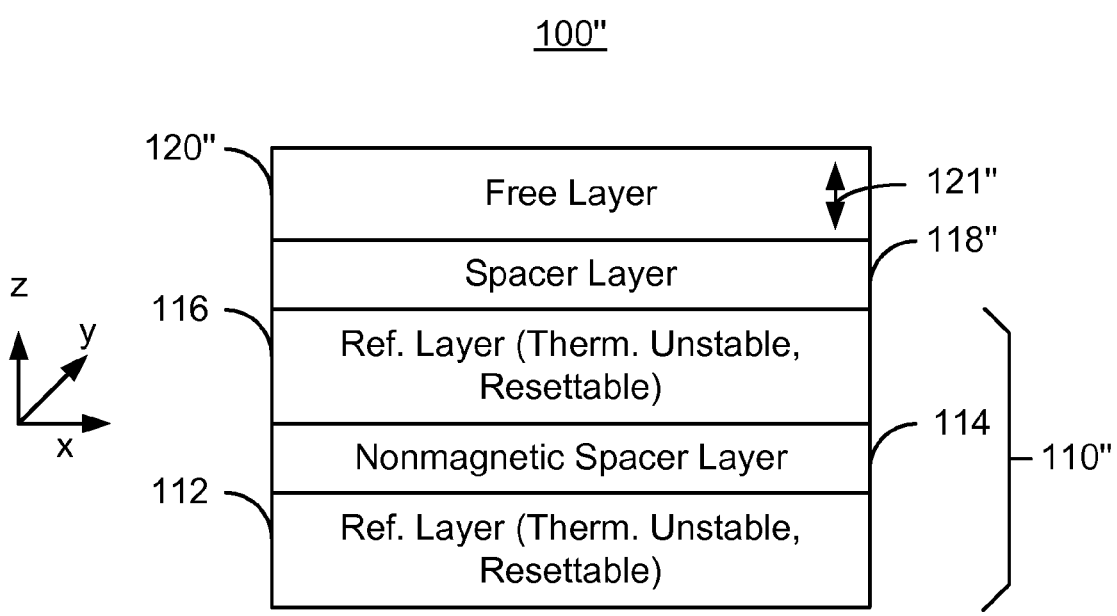
FIG. 7 is a diagram depicting another exemplary embodiment of a magnetic element switchable with a unidirectional current.

FIG. 7 is a diagram depicting another exemplary embodiment of a magnetic element 100" switchable with a unidirectional current. Portions of the magnetic element 100' are analogous to the magnetic elements 100 and 100' depicted in FIGS. 5A-6. Consequently, portions of the magnetic element 100" are labeled similarly. The magnetic element 100' thus includes a reference layer 110", a spacer layer 118", and a free layer 120". In addition, seed layer(s) (not shown) and capping layer(s) (not shown) may also be used. For clarity, the magnetizations of layers in the magnetic element 100" are described as being out-of-plane. However, in another embodiment, the magnetizations could have a component and/or be completely in-plane.

The free layer 120" is analogous to the free layer 120. Thus, the magnetization 121" of the free layer 120' is thermally stable and may be switched when a write current is passed through the magnetic element. The magnetic element 100" is configured such that spin transfer torque may be used in switching the free layer 120". As a result, the lateral dimensions of the magnetic element 100" are preferably less than two hundred nanometers. In one embodiment, the lateral dimensions of the magnetic element 100' may be on the order of ninety nanometers or less.

The spacer layer 118" is analogous to the spacer layer 118. The spacer layer 118", therefore, is nonmagnetic and may be a barrier layer such as an insulating tunneling barrier layer. In other embodiments, the spacer layer 118' may be conductive or may have another structure, for example a granular layer including conductive channels in an insulating matrix.

The reference layer 110" is analogous to the reference layers 110 and 110' Thus, the reference layer 110 is not magnetically thermally stable at room temperature. The reference layer 110' is a synthetic layer including two magnetic layers 112 and 116 separated by a nonmagnetic spacer layer 114, such as Ru. The use of three layers 112, 114, and 116 may provide a low magnetostatic coupling field between the layers 112 and 116. In one embodiment, the magnetostatic field coupling is controlled to reduce or preclude an offset field on the free layer 120".

In one embodiment, the reference layer 110' includes superparamagnetic layer(s) and/or layer(s) having a coercivity of not more than approximately twenty Oe. For example, the magnetic layer 112 may be a superparamagnetic layer and/or may simply have a coercivity of less than twenty Oe. In another embodiment, the magnetic layer 112 may have multiple domains, but have a coercivity of not more than approximately twenty Oe. Similarly, the magnetic layer 116 may be a superparamagnetic layer and/or may simply have a coercivity of less than twenty Oe. In another embodiment, the magnetic layer 116 may have multiple domains, but have a coercivity of not more than approximately twenty Oe. The reference layer 110" is used to spin polarizes the write current when the magnetic element 100" is written. In addition, differences between the directions of the magnetization of the reference layer 110" and the magnetization 121' of the tree layer 120" may be used to read data stored by the magnetic element 100".

The magnetic element 100" operates in an analogous manner to the magneto element 100. Thus, an external magnetic field (not shown) is used in writing and reading the magnetic element 100". If the magnetic element 100" is to be written to a first state then the external magnetic field is generated in the −x or +z direction and a write current is driven from the free layer 120" to the reference layer 110. If the magnetic element 100" is to be written to a second state, then the external magnetic field is generated in the x or −z direction and a write current is driven from the free layer 120" to the reference layer 110". Because electrons pass through the reference layer 110", the write current becomes spin polarized. As a result, the magnetization 121" of the free layer 120" is set to the x or −z direction.

In order to read the magnetic element 100, an external magnetic field (not shown) that may be in the same direction for all read operations is generated and a read current is driven through the magnetic element 100'. In one embodiment, the read current is less than the write current and is sufficiently small that the magnetization 121" of the free layer 120" is not switched. Based upon the magnitude of the signal from the magnetic element 100", the direction of the magnetizations 121" may be determined. Thus, state of the magnetic element 100" can be determined.

Thus, the magnetic element 100" may be written using a unidirectional current in conjunction with the external magnetic field. The external magnetic field used may be bidirectional and is used to select which of the states to which the magnetic element 100 is to be written. Because of the use of the reference layer 110" having the thermally unstable, resettable magnetizations, a lower current may be used to generate the external magnetic field. This current may stay low for future even smaller and denser memories. Because the magnetic element 100" may be written using a unidirectional current, the size of a storage cell fabricated using the magnetic element may be made smaller. Thus, the magnetic element 100" may be better able to be used in a high density memory.

Figure 8:
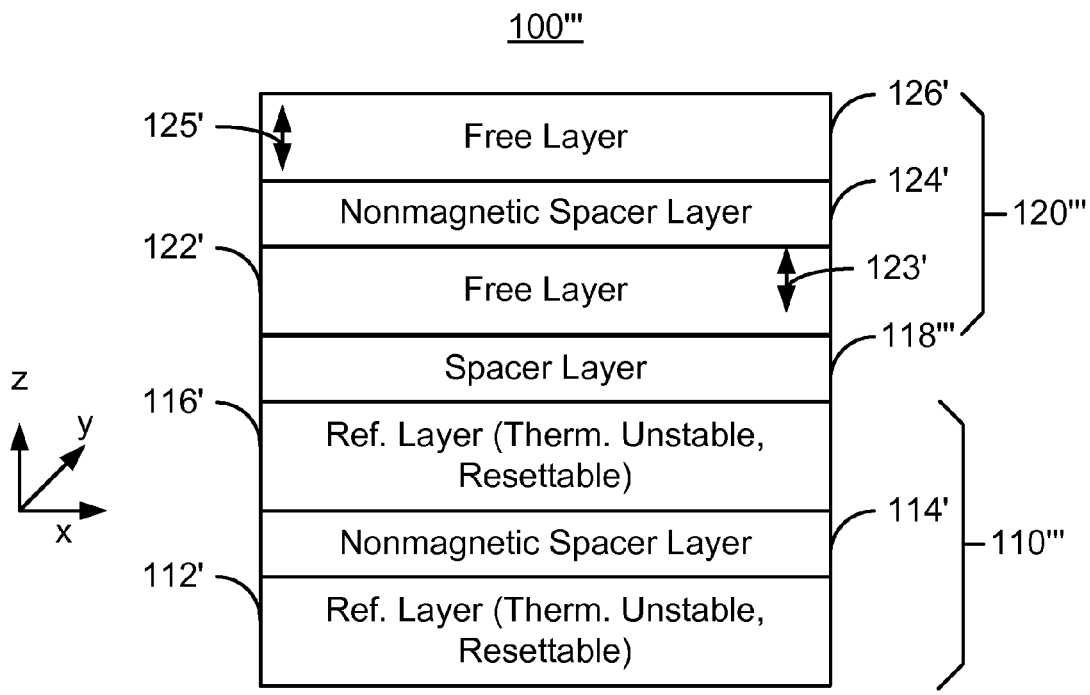
FIG. 8 is a diagram depicting another exemplary embodiment of a magnetic element switchable with a unidirectional current.

FIG. 8 is a diagram depicting another exemplary embodiment of a magnetic element 100" switchable with a unidirectional current. Portions of the magnetic element 100" are analogous to the magnetic elements 100, 100', and 100" depicted in FIGS. 5A-7. Consequently, portions of the magnetic element 100''' are labeled similarly. The magnetic element 100''' thus includes a reference layer 110", a spacer layer 118", and a free layer 120". In addition, seed layer(s) (not shown) and capping layer(s) (not shown) may also be used. For clarity, the magnetizations of layers in the magnetic element 100" is described as being out-of-plane. However, in another embodiment, the magnetizations could have a component and/or be completely in-plane.

The free layer 120" is analogous to the free layer 120'. Thus, the free layer 120" includes ferromagnetic layers 122' and 126' separated by a nonmagnetic spacer layer 124', such as Ru. The free layer 120" is thermally stable at room temperature. Because the free layer 120" is synthetic, the thermal stability of the free layer 120" may be improved without substantially increasing the spin transfer torque switching current density for the free layer 120". The use of three layers 122', 124', and 126' may provide a low magnetostatic coupling field. In one embodiment, the magnetostatic field coupling is controlled to reduce or preclude an offset field on the reference layer 110". In another embodiment, additional ferromagnetic layers (not shown) interleaved with nonmagnetic spacer layers (not shown) may also be used. In one embodiment, the magnetizations 123' and 125' are antiferromagnetically coupled. The equilibrium position(s) of the magnetizations 123' and 125' of the free layer 120''' may be along an easy axis (not separately shown in FIG. 8). The magnetic element 100''' is also configured such that the magnetizations 123' and/or 125' of the free layer 120' may be switched when a write current is passed through the magnetic element. Thus, the magnetic element 100''' is configured such that spin transfer torque may be used in switching the free layer 120'''. As a result, the lateral dimensions of the magnetic element 100''' are preferably less than two hundred nanometers. In one embodiment, the lateral dimensions of the magnetic element 100' may be on the order of ninety nanometers or less.

The spacer layer 118''' is analogous to the spacer layer 118. Thus, the spacer layer 118''' is nonmagnetic and may be a barrier layer such as an insulating tunneling barrier layer. In other embodiments, the spacer layer 118''' may be conductive or may have another structure, for example a granular layer including conductive channels in an insulating matrix.

The reference layer 110''' is analogous to the reference layers 110, 110', and 110". Thus, the reference layer 110''' as not magnetically thermally stable at room temperature. The reference layer 110''' is a synthetic layer including two magnetic layers 112' and 116' separated by a nonmagnetic spacer layer 114', such as Ru. The use of three layers 112', 114', and 116' may provide a low magnetostatic coupling field between the layers 112' and 116'. In one embodiment, the magnetostatic field coupling is controlled to reduce or preclude an offset field on the free layer 120'''. Optionally, layer 116' may have high damping constant. In one embodiment, the damping constant of the layer 116 is greater than the dam ping constant of the tree layer 120". As a result the free layer 120" may be switched by spin transfer torque writing, while the layer 116 remains substantially undisturbed by the spin transfer torque writing. Optionally, layer 116' may have high spin polarization.

In one embodiment, one or more of the layers 112' and 114' is a superparamagnetic layer and/or a layer having a coercivity of not more than approximately twenty Oe. For example, the magnetic layer 112' may be a superparamagnetic layer and/or may simply have a coercivity of less than twenty Oe. In another embodiment, the magnetic layer 112' may have multiple domains but have a coercivity of not more than approximately twenty Oe. The magnetic layer 116' may be similarly configured. The reference layer 110''' is used to spin polarize the write current when the magnetic element 100''' is written. In addition, differences between the directions or the magnetization of the reference layer 110" and the magnetization 123' of the free layer 120''' may be used to read data stored by the magnetic element 100'''.

The magnetic element 100''' operates in an analogous manner to the magnetic element 100. Thus, an external magnetic field (not shown) is used in writing and reading the magnetic element 100'''. If the magnetic element 100''' is to be written to a first state then the external magnetic field is generated in the −x or +z direction and a writ current is driven from the free layer 120''' to the reference layer 110'''. If the magnetic element 100''' is to be written to a second state, then the external magnetic field is generated in the x or −z direction and a write current is driven from the free layer 120''' to the reference layer 110'''. Because electrons pass through the reference layer 110''', the write current becomes spin polarized. As a result, the magnetization 123' of the free layer 120''' is set to the desired direction.

In order to read the magnetic element 100''', an external magnetic field (not shown) that may be in the same direction for all read operations is generated and a read current is driven through the magnetic element 100'''. In one embodiment, the read current is less than the write current and is sufficiently small that the free layer 120''' is not switched. Based upon the magnitude of the signal from the magnetic element 100''', the direction of the magnetizations 123' may be determined. Thus, state of the magnetic element 100''' can be determined.

Thus, in one embodiment, the magnetic element 100''' is written using a unidirectional current in conjunction with the external magnetic field. Because of the use of the reference layer 110''' having the thermally unstable, resettable magnetizations, a lower current may be used to generate the external magnetic field. The external magnetic field used may be bidirectional and is used to select which of the states to which the magnetic element 100 is to be written. Because the magnetic element 100''' may be written using a unidirectional current, the size of a storage cell fabricated using the magnetic element may be made smaller. In addition, the tree layer 120''' may have improved thermal stability. Thus, the magnetic element 100''' may be better able to be used in a high density memory.

Figure 9:
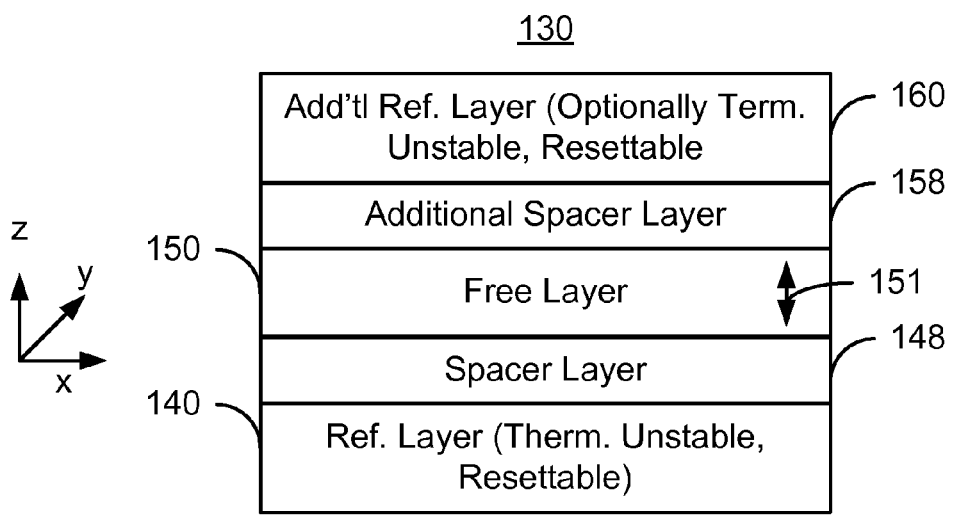
FIG. 9 is a diagram depicting another exemplary embodiment of a magnetic element switchable with a unidirectional current.
Figure 10:
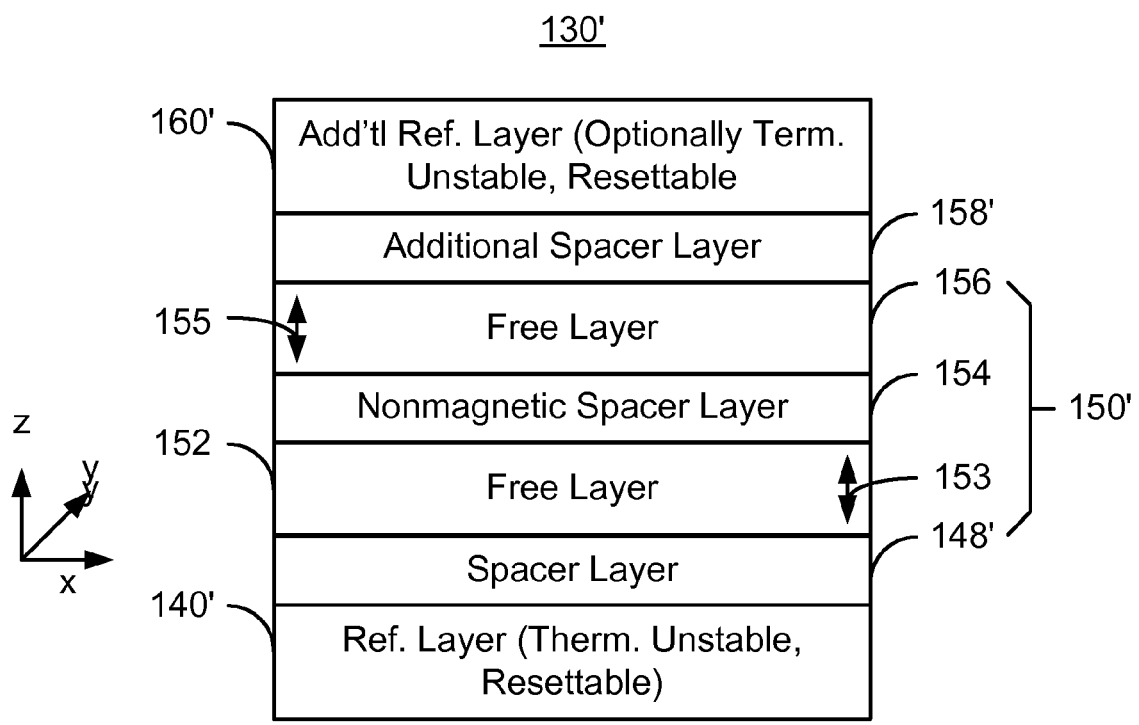
FIG. 10 is a diagram depicting another exemplary embodiment of a magnetic element switchable with a unidirectional current.
Figure 11:
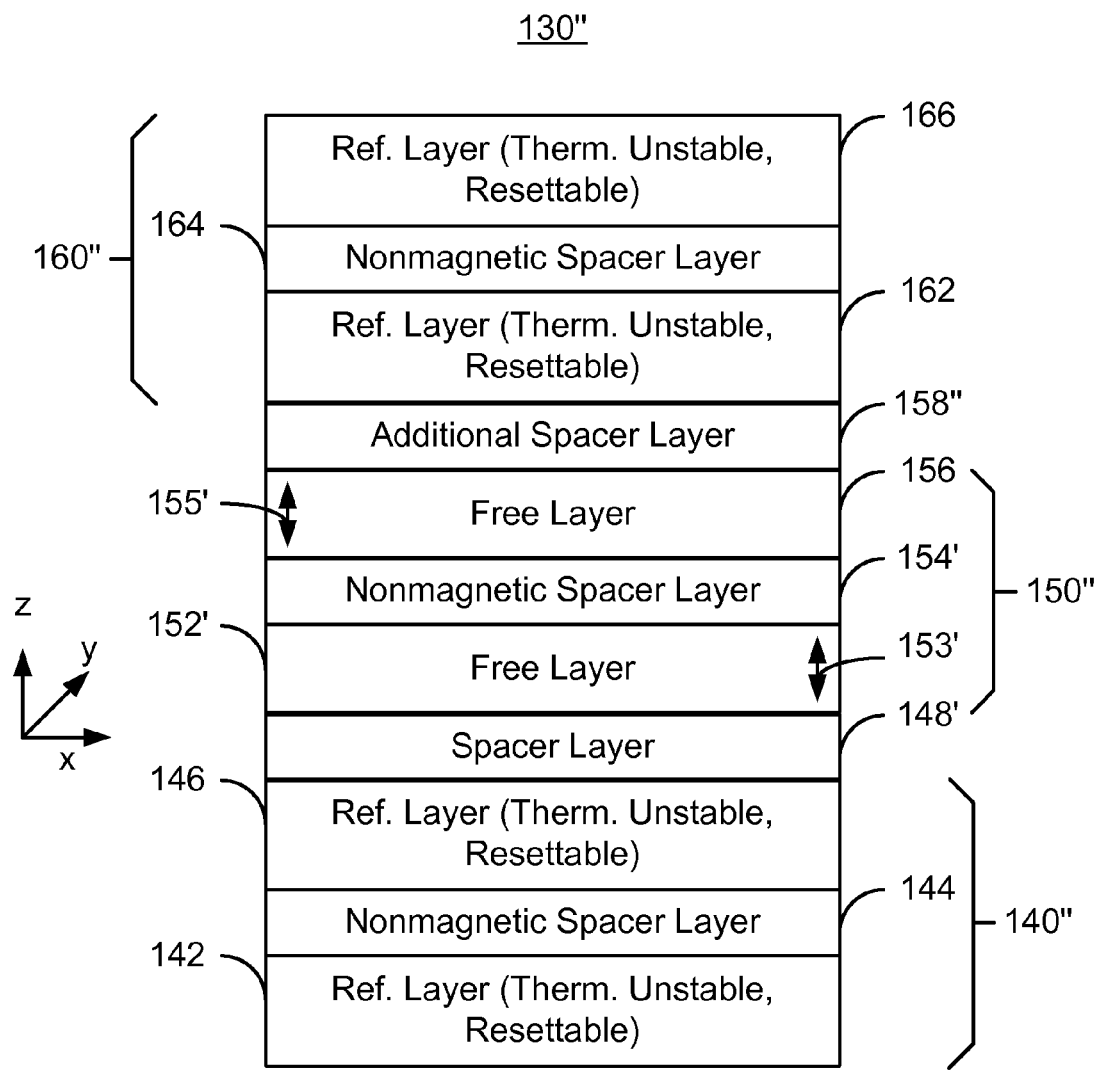
FIG. 11 is a diagram depicting another exemplary embodiment of a magnetic element switchable with a unidirectional current.

In addition to the magnetic elements 100, 100', 100", and 100''', dual magnetic elements having thermally stable free layers and thermally unstable reference layers may be used. Such magnetic elements can be viewed as including one of the magnetic elements 100, 100', 100", and 100" as well as an additional spacer layer and an additional reference layer. The additional reference layer may be or include a superparamagnetic layer and/or have a coercivity of not more than approximately twenty Oe. The additional spacer layers may be conductive or insulating. In one embodiment, the additional spacer layer would have a different resistance than the spacer layer 118, 118', 118", and 118''' of the magnetic element 100, 100', 100", and 100''' also included in the dual magnetic element. FIGS. 9-11 depict exemplary embodiments of such dual magnetic elements. However, other embodiments may also be utilized.

FIG. 9 is a diagram depicting another exemplary embodiment of a magnetic element 130 switchable with a unidirectional current. The magnetic element 130 includes a first reference layer 140, a first spacer layer 148, a free layer 150, a second, or additional, spacer layer 158, and a second, or additional reference layer 160. In addition, seed layer(s) (not shown) and capping layer(s) (not shown) may also be used. For clarity, the magnetizations of layers in the magnetic element 130 are described as being out-of-plane. However, in another embodiment, the magnetizations could have a component and/or be completely in-plane. Magnetizations are also shown in particular directions, but may reside in other direction(s).

The free layer 150 is ferromagnetic and includes at least one of Co, Ni, and Fe. The free layer 150 has a magnetization 151 that is thermally stable. Stated differently, once the magnetization 151 of the free layer 150 is written (set to a particular state/direction) the magnetization 151 of the free layer 150 remains substantially in that direction. In one embodiment, the thermal constant ($K_uV/k_BT$) for the free layer 150 is at least approximately fifty five. Although depicted as a simple layer, the free layer 150 may be a synthetic layer including multiple (e.g. two or more) ferromagnetic layers separated by nonmagnetic spacer layer(s), such as Ru. In such an embodiment, the ferromagnetic layers may be antiferromagnetically coupled. Use of a synthetic free layer may enhance thermal stability without substantially increasing the spin transfer torque switching current density. The equilibrium position(s) of the magnetization 151 of the free layer 150 may be along an easy axis (not separately shown in FIG. 9). The magnetic element 130 is also configured such that the magnetization 151 of the free layer 120 may be switched when a write current is passed through the magnetic element.

Thus, the magnetic element 130 is configured such that spin transfer torque may be used in switching the magnetization 151 of the free layer. As a result, the lateral dimensions of the magnetic element 130 are preferably less than two hundred nanometers. In one embodiment, the lateral dimensions of the magnetic element 130 may be on the order of ninety nanometers or less.

The spacer layers 148 and 158 are nonmagnetic. Each of the spacer layers 148 and 158 may be a barrier layer such as an insulating tunneling barrier layer, conductive, or have another structure. In an alternate embodiment, each of the spacer layers 148 and 158 might have another structure, for example a granular layer including conductive channels in an insulating matrix. In one embodiment, both of the spacer layers 148 and 158 are barrier layers. In one embodiment, the spacer layers 148 and 158 have different resistance. The spacer layer having the higher resistance area product, for example, spacer layer 148 may control the tunneling magnetoresistance ratio. For example, if the magnetizations of the reference layers 140 and 160 are antiparallel, the magnetization 151 of the free layer 150 will be in a high resistance state with respect to one of the reference layers 140 and 160 and in a low resistance state with respect to the other of the reference layers. Use of spacer layers 148 and 158 having different resistance area products (and different resistances) may allow the states of the free layer 150 to be distinguished.

The magnetizations of the reference layers 140 and 160 are used to spin polarize the write current when the magnetic element 130 is written. In addition, differences between the direction of magnetization of the reference layers 140 and 160 and the tree layer 150 may be used to read data stored by the magnetic element 130. However, at least one of the reference layers 140 and 160 is not magnetically thermally stable at room temperature. Thus, at least one of the reference layers 140 and 160 is analogous to the reference layers 110/110'/101"/110'". The reference layer 140 and/or 160 is a superparamagnetic layer and/or has a coercivity of not more than approximately twenty Oe. For example, the reference layer 140 and/or 160 may be and/or include a superparamagnetic layer. In another embodiment, the reference layer 140 and/or 160 may have multiple domains, but have a coercivity of not more than approximately twenty Oe. In one embodiment, both reference layers 140 and 160 are not thermally stable at room temperature and thus one may have its magnetization reset by an external magnetic field, while the other may have its magnetization reset by flux closure in opposite direction.

The reference layers 140 and 160 may also be magnetostatically coupled. At smaller dimensions, this may cause the magnetizations (not shown) of the reference layers 140 and 160 to be antiferromagnetically aligned by the magnetostatic coupling to form a flux closure. However, the direction of magnetizations of the reference layers 140 and 160 may still be set by an external magnetic field.

The magnetic element 130 operations in an analogous manner to the magnetic elements 100/100'/100"/100'". In particular, an external magnetic field is used in writing and reading the magnetic element 130. If the magnetic element 130 is to be written to a first state (magnetization 151 in the −x or +z direction, then an external magnetic field (not shown) is generated in the x or +z direction. For the purposes of explanation it is assumed that the magnetization of the reference layer 140 is aligned with the external magnetic field. In addition, a write current is driven through the magnetic element 130 from the reference layer 160 to the reference layer 140. Because electrons pass through the reference layer 140, the write current becomes spin polarized. In addition, electrons polarized in the −x or +z direction tend to be reflected from the reference layer 160 if its magnetization is antiferromagnetically aligned to the magnetization of the reference layer 140. As a result, the magnetization 151 of the tree layer 150 is set to the −x or +z direction. If the magnetic element 130 is to be written to a second state (free layer 150 magnetization 151 in the x or −z direction), then the external magnetic field is generated in the x or −z direction. In addition, a write current is driven through the magnetic element 100, from the reference layer 160 to the reference layer 140. Because electrons pass through the reference layer 140 and electrons polarized in the x or −z direction may tend to be reflected from the reference layer 160, the write current becomes spin polarized. As a result, the magnetization 151 of the tree layer 150 is set to the x or −z direction.

In order to read the magnetic element 130, an external magnetic field in the +x (−z) or the −x (+z) direction may be generated. In one embodiment, the external magnetic field has the same direction for all read operations. For clarity a read operation is described in the context of the magnetic field in the −x (+z) direction. Because of the presence of the magnetic field, the magnetization of the reference layer 140 is in the −x (+z) direction. The magnetization of the reference layer 160 may be in the x (−z) direction if the reference layers 140 and 160 are antiferromagnetically aligned. A read current is driven through the magnetic element 130. In one embodiment, the read current is less than the write current and is sufficiently small that the magnetization 151 of the free layer 150 is not switched. Based upon the magnitude of the signal from the magnetic element 130, the direction of the magnetization 151 may be determined. Thus, state of the magnetic element 130 can be determined.

Thus, the magnetic element 130 is written using a unidirectional current in conjunction with the external magnetic field. The external magnetic field used may be bidirectional and is used to select which of the states to which the magnetic element 130 is written. Because the magnetic element 130 may be written using a unidirectional current, the size of a storage cell fabricated using the magnetic element may be made smaller. Because of the use of the reference layer 110 having the thermally unstable, resettable magnetizations, a lower current may be used to generate the external magnetic field. Thus, the magnetic element 130 may be better able to be used in a high density memory.

FIG. 10 is a diagram depicting another exemplary embodiment of a magnetic element 130' switchable with a unidirectional current. The magnetic element 130' includes a first reference layer 140', a first spacer layer 148', a free layer 150', a second, or additional, spacer layer 158', and a second, or additional reference layer 160'. In addition, seed layer(s) (not shown) and capping layer(s) (not shown) may also be used. For clarity, the magnetizations of layers in the magnetic element 130' are described as being out-of-plane. However, in another embodiment, the magnetizations could have a component and/or be completely in-plane.

The free layer 150' is analogous to the free layer 150. However, the free layer 150' is a synthetic layer including two ferromagnetic layers 152 and 156 separated by a nonmagnetic spacer layer 154, such as Ru. Because the free layer 150' is synthetic, the thermal stability of the free layer 150' may be improved without substantially increasing the spin transfer torque switching current density for the free layer 150'. The use of three layers 152, 154, and 156 may provide a low magnetostatic coupling field. In one embodiment, the magnetostatic field coupling is controlled to reduce or preclude an offset field on the reference layers 140' and 160'. In another embodiment, additional ferromagnetic layers (not shown) interleaved with nonmagnetic spacer layers (not shown) may also be used. In one embodiment, the magnetizations 153 and 155 are antiferromagnetically coupled. The equilibrium position(s) of the magnetizations 153 and 155 of the free layer 150' may be along an easy axis (not separately shown in FIG. 10). The magnetic element 130' is also configured such that the magnetizations 153 and/or 155 of the free layer 150' may be switched when a write current is passed through the magnetic element. Thus, the magnetic element 130' is configured such that spin transfer torque may be used in switching the free layer 150'. As a result, the lateral dimensions of the magnetic element 130' are preferably less than two hundred nanometers. In one embodiment, the lateral dimensions of the magnetic element 130' may be on the order of ninety nanometers or less.

The spacer layers 148' and 158' are nonmagnetic and analogous to the spacers 148 and 159, respectively, of FIG. 9. Similarly, the reference layer 140' and 160' are analogous to the reference layers 140 and 160, respectively. The magnetizations of the reference layers 140' and 160' are used to spin polarize the write current when the magnetic element 130's written. In addition, differences between the direction of magnetization of the reference layers 140' and 160' and the free layer 150' may be used to read data stored by the magnetic element 130'. At least one of the reference layers 140' and 160' is not magnetically thermally stable at room temperature. Thus, at least one of the reference layers 140' and 160' is analogous to the reference layers 110/110'/110"/110'''. The reference layer 140' and/or 160' is a superparamagnetic layer and/or has a coercivity of not more than approximately twenty Oe. For example, the reference layer 140' and, or 160' may be and/or include a superparamagnetic layer. In another embodiment, the reference layer 140' and/or 160' may have multiple domains, but have a coercivity of not more than approximately twenty Oe. In one embodiment, both reference layers 140' and 160' are not thermally stable at room temperature and thus one may have its magnetization reset by an external magnetic field, while the other may be reset by flux closure. The reference layers 140' and 160' may also be magnetostatically coupled. At smaller dimensions, this may cause the magnetizations (not shown) of the reference layers 140' and 160' to be antiferromagnetically aligned by the magnetostatic coupling to form a flux closure. However, the direction of magnetizations of the reference layers 140' and 160' may still be set by an external magnetic field.

The magnetic element 130' operations in an analogous manner to the magnetic elements 100/100'/100"/100"/100'''/130. In particular, an external magnetic field is used in writing and reading the magnetic element 130'. If the magnetic element 130's to be written to a first state (net magnetization of the free layer 150' in the −x or +z direction), then an external magnetic field (not shown) is generated in the −x or +z direction. The write current may be driven through the magnetic element 130' from the reference layer 160' to the reference layer 140'. Because electrons pass through the reference layer 140', the write current becomes spin polarized. In addition, electrons polarized in the −x (+z) direction tend to be reflected from the reference layer 160' if its magnetization is antiferromagnetically aligned to the magnetization of the reference layer 140'. As a result, the magnetization 153 of the ferromagnetic layer 152 of the free layer 150' is set to the −x (+z) direction. If the magnetic element 130' is to be written to a second state, then the external magnetic field is generated in the x (−z) direction and a write current is driven through the magnetic element 130' in the same direction. Because electrons polarized in the x (−z) direction pass through the reference layer 140' and are reflected by the reference layer 160', the write current becomes spin polarized. As a result, the magnetization 123 of the free layer 120' is set to the x (−z) direction.

In order to read the magnetic element 130', an external magnetic field in the +x (−z) or the −x (+z) direction may be generated. In one embodiment, the external magnetic field has the same direction for all read operations. A read operation is analogous to that described above for the magnetic element 130' and is, therefore, not further described. Thus, state of the magnetic element 130' can be determined.

Thus, the magnetic element 130' is written using a unidirectional current in conjunction with the external magnetic field. The external magnetic field used may be bidirectional and is used to select which of the states to which the magnetic element 130' is written. Because the magnetic element 130' may be written using a unidirectional current, the size of a storage ell fabricated using the magnetic element may be made smaller. Because of the use of the reference layer 110' having the thermally unstable, resettable magnetizations, a lower current may be used to generate the external magnetic field. Thus, the magnetic element 130' may be better able to be used in a high density memory.

FIG. 11 is a diagram depicting another exemplary embodiment of a magnetic element 130" switchable with a unidirectional current. The magnetic element 130" includes a first reference layer 140", a first spacer layer 148", a free layer 150", a second, or additional, spacer layer 158", and a second, or additional reference layer 160". In addition, seed layer(s) (not shown) and capping layer(s) (not shown) may also be used. For clarity, the magnetizations of layers in the magnetic element 130" are described as being out-of-plane. However, in another embodiment, the magnetizations could have a component and/or be completely in-plane.

The free layer 150" is analogous to the free layer 150/150'. In the embodiment depicted, the free layer 150" is shown as being a synthetic free layer including layers 152', 154', and 156'. However, in another embodiment, the free layer 150" may be a simple free layer including a single magnetic layer. Because the free layer 150" is synthetic, the thermal stability of the free layer 150" may be improved without substantially increasing the spin transfer torque switching current density for the free layer 150". The use of three layers 152', 154', and 156' may provide the advantages described for the layers 152, 154, and 156. The magnetic element 130" is also configured such that the magnetizations 153' and/or 155' of the free layer 150" may be switched when a write current is passed through the magnetic element. Thus, the magnetic element 130" is configured such that spin transfer torque may be used in switching the free layer 150". As a result, the lateral dimensions of the magnetic element 130" are preferably less than two hundred nanometers. In one embodiment, the lateral dimensions of the magnetic element 130' may be on the order of ninety nanometers or less.

The spacer layers 148" and 158" are nonmagnetic and analogous to the spacers 148/148' and 158/158', respectively, of FIGS. 9-10. Similarly, the reference layers 140" and 160" are analogous to the reference layers 140/140' and 160/160', respectively. However, at least one of the reference layers 140" and 160" is a synthetic layer. In the embodiment shown, both of the reference layers 140" and 160" are synthetic, including layers 142, 144, and 146 and layers 162, 164, and 166, respectively. The magnetizations of the reference layers 140' and 160' are used to spin polarize the write current when the magnetic element 130" is written. In addition, differences between the direction of magnetization of the reference layers 140" and 160" and the free layer 150' may be used to read data stored by the magnetic element 130". At least one of the reference layers 140''' and 160''' is not magnetically thermally stable at room temperature. Thus, at least one of the reference layers 140" and 160" is analogous to the reference layers 110/110'/110"/110'''/140/160/140'/160' The reference layer 140" and/or 160" thus includes one or more superparamagnetic layer(s) and/or has a coercivity of not more than approximately twenty Oe. For example, the reference layer 140" and/or 160" may be and/or include a superparamagnetic layer. In another embodiment, layers 142, 146, 162, and 166 for the reference layer 140" and/or 160" may have multiple domains, but have a coercivity of not more than approximately twenty Oe. In one embodiment, both reference layers 140" and 160" include layer(s) that are not thermally stable at room temperature and thus may have their magnetizations reset by an external magnetic field. The reference layers 140" and 160" may also be magnetostatically coupled. At smaller dimensions, this may cause the magnetizations (not shown) of the reference layers 140" and 160" to be antiferromagnetically aligned by the magnetostatic coupling to form a flux closure. However, the direction of magnetizations of the reference layers 140" and 160" may still be set by an external magnetic field.

The magnetic element 130" operations in an analogous manner to the magnetic elements 100/100'/100"/100'''/130/130'. In particular, an external magnetic field is used in writing and reading the magnetic element 130". If the magnetic element 130" is to be written to a first state (net magnetization of the free layer 150" in the −x or +z direction), then an external magnetic field (not shown) is generated in the −x or +z direction. The write current may be driven through the magnetic element 130" from the reference layer 160" to the reference layer 140". Because of the spin polarization of current through the layers(s) of the reference layers 140" and 150", the free layer 150" is set to the −x or +z direction. If the magnetic element 130" is to be written to a second state, then the external magnetic field is generated in the x or −z direction and a write current is driven through the magnetic element 130" in the same direction. Because electrons polarized in the x or −z direction pass through the reference layer 140" and are reflected by the reference layer 160', the write current becomes spin polarized. As a result, the free layer 120" is set to the x or −z direction.

In order to read the magnetic element 130", an external magnetic field in the +x (−z) or the −x (+z) direction may be generated. In one embodiment, the external magnetic field has the same direction for all read operations. A read operation is analogous to that described above for the magnetic element 130" and is, therefore, not further described. Thus, state of the magnetic element 130" can be determined.

Thus, the magnetic element 130' is written using a unidirectional current in conjunction with the external magnetic field. The external magnetic field used may be bidirectional and is used to select which of the states to which the magnetic element 130" is written. Because the magnetic element 130" may be written using a unidirectional current, the size of a storage cell fabricated using the magnetic element may be made smaller. Because of the use of the reference layers 140" and 160" having the thermally unstable, resettable magnetizations, a lower current may be used to generate the external magnetic field. Thus, the magneto element 130' may be better able to be used in a high density memory.

Figure 12:
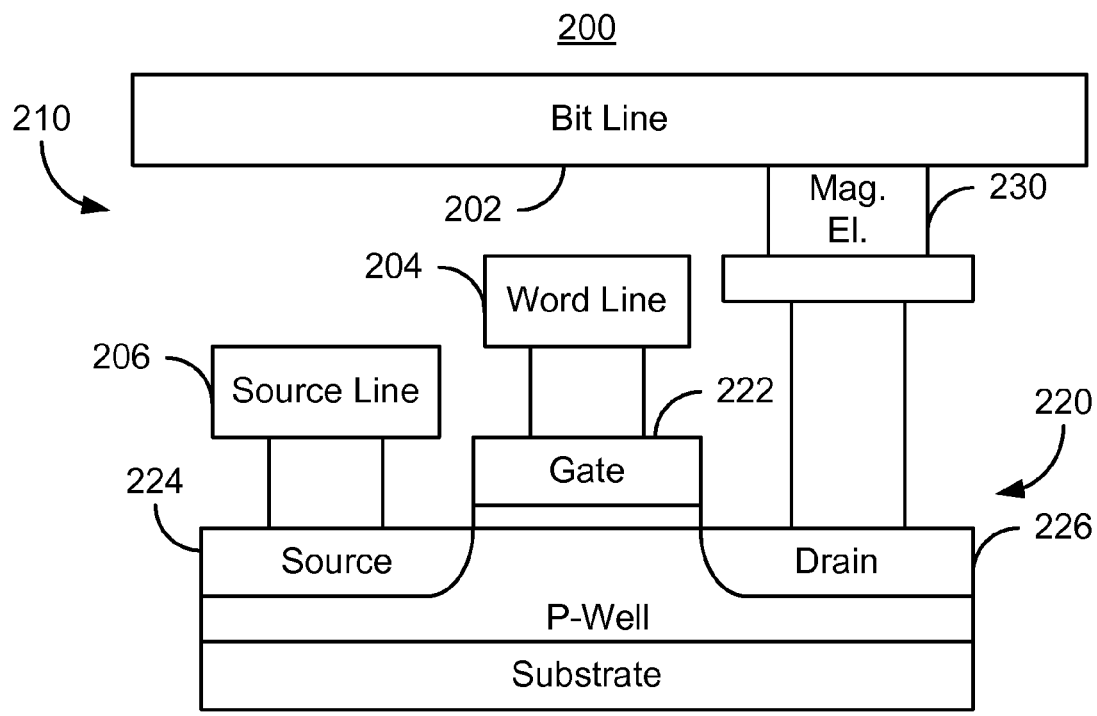
FIG. 12 is a diagram depicting an exemplary embodiment of a portion of a memory utilizing a magnetic element switchable with a unidirectional current.

FIG. 12 is a diagram depicting an exemplary embodiment of a portion of a memory 200 utilizing a magnetic element switchable with a unidirectional current. Although particular memory cell 210 is shown, the magnetic memory 200 typically includes a number of magnetic memory cells 210 arranged in an array. The magnetic memory cell 210 includes a transistor 220 and a magnetic element 230. The magnetic element 230 might be any of the magnetic elements 100, 100', 100", 100''', 130, 130', and/or 130". Thus, the magnetic element 230 may include reference layer(s) 110/110'/110"/110'''/140/160/140'/160'/140"/160". The transistor 220 includes a gate 222, a source 224 and drain 226. Although only one transistor 220 is shown, another number may be included. The transistor 220 may used to select the memory cell 210. However, in another embodiment, other selection device/devices may be used. The transistor 220 may be an NMOS device. In another embodiment, however, a PMOS device may be used. Also shown are a bit line 202, word line 204, and source line 206.

In order to write to the magnetic element 230, a current is driven through the bit line 202 to the source line 206. The current through the bit line 204 also generates the magnetic field used in setting the magnetization direction of reference layer(s) 110/110'/110"/110'''/140/160/140'/160'/140"/160". Alternatively, opposite currents in neighboring bit lines (not shown) to bit line 202 might be used to generate vertical field at magnetic element 230. Although a unidirectional current through the magnetic element 230 is used, the current may be into the page or out of the page in FIG. 12. As a result, the magnetic field on the reference layer(s) 110/110'/110"/110'''/140/160/140'/160'/140"/160" may differ depending upon the data desired to be written. Thus, the magnetic element 230 may be written to the desired state using a unidirectional current from the bit line 202 to the source line 206. Note that in an alternate embodiment, a unidirectional current from the source line 206 or word line 204 to the bit line 202 might be used.

In order to read the magnetic memory cell 210, an external magnetic field may be generated by the bit line 202. Alternatively, opposite currents in neighboring bit lines (not shown) to bit line 202 can be used to generate vertical field at magnetic element 230. In one embodiment, the external magnetic field has the same direction for all read operations. A read operation is analogous to that described above for FIGS. 5A-11 and the magnetic elements 100/100'/100"/100'''/130/130'/130". The read operation is, therefore, not further described. Thus, state of the magnetic element 230 can be determined.

Thus, the magnetic memory cell 210 is written using a unidirectional current in conjunction with the external magnetic field. The external magnetic field used may be bidirectional and is used to select which of the states to which the magnetic element 230 is written. Because the magnetic element 230 may be written using a unidirectional current, the size of the storage cell 210 may be smaller. Because of the use of the reference layer(s) 110/110'/110"/110'''/140/160/140'/160'/140"/160" having the thermally unstable, resettable magnetizations, a lower current may be used to generate the external magnetic field. Thus, the magnetic element 230 may be better able to be used in a high density memory.

Figure 13:
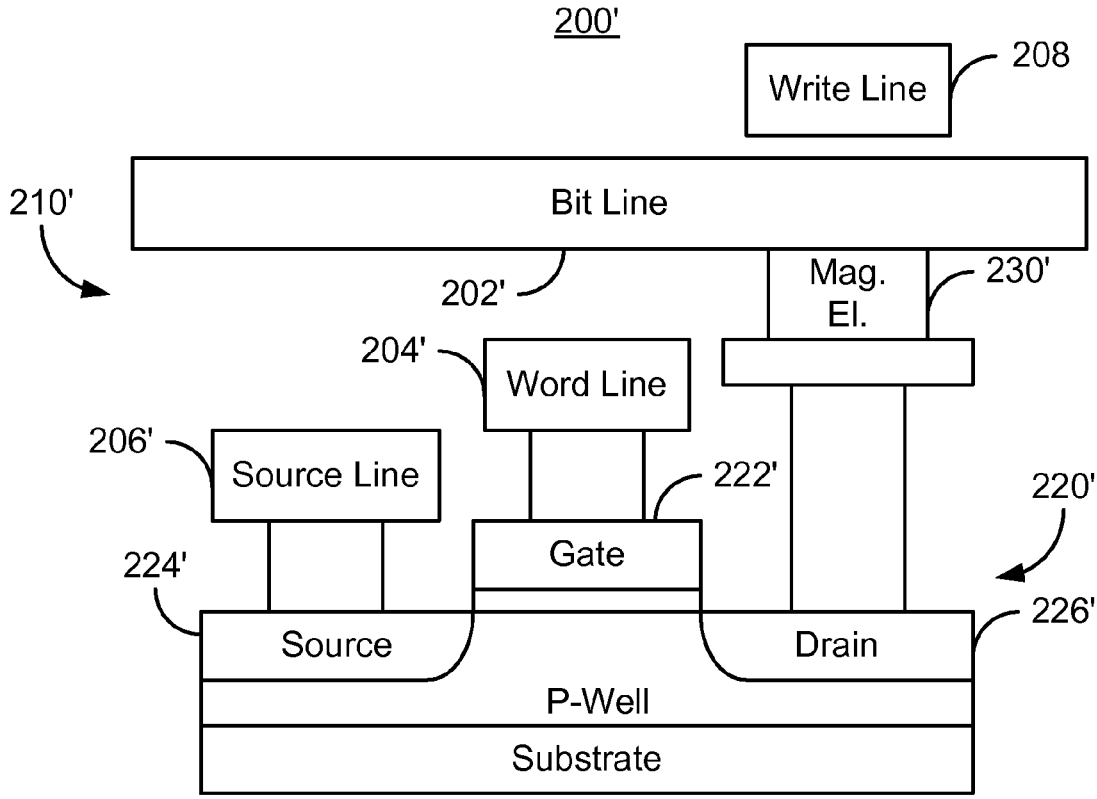
FIG. 13 is a diagram depicting another exemplary embodiment of a portion of a memory utilizing a magnetic element switchable with a unidirectional current.

FIG. 13 is a diagram depicting another exemplary embodiment of a portion of a memory 200' utilizing a magnetic element 230' switchable with a unidirectional current. The magnetic memory 200' is analogous to the magnetic memory 200. Consequently, analogous components are labeled similarly. The magnetic memory 200' thus includes a magnetic memory cell 210' including a magnetic element 230' and a transistor 220' that are analogous to the memory cell 210, magnetic element 230, and transistor 220, respectively. Although particular memory cell 210' is shown, the magnetic memory 200' typically includes a number of magnetic memory cells 210' arranged in an array. The magnetic element 230' might be any of the magnetic elements 100, 100',

100″, 100‴, 130, 130′, and/or 130″. Thus, the magnetic element 230′ may include reference layer(s) 110/110′/110″/110‴/140/160/140′/160′/140″/160″. The transistor 220′ includes a gate 222′, a source 224′ and drain 226′. Although only one transistor 220′ is shown, another number may be included. The transistor 220′ may be used to select the memory cell 210′. However, in another embodiment, other selection device/devices may be used. The transistor 220′ may be an NMOS device. In another embodiment, however, a PMOS device may be used. The bit line 202′, word line 204′, and source line 206′ are analogous to the bit line 202, word line 204, and source line 206 respectively. In addition, the magnetic memory 200′ includes a write line 208. Although write line 208 is shown above magnetic element 230′, it may be placed at another location, for example offset horizontally from 230′ to produce a vertical field.

In order to write to the magnetic element 230′, a current is driven through the bit line 204′ to the source line 206′. In addition, an additional current is driven through the write line 208. The current through the write line 208 or neighboring write lines (not shown) generates the magnetic field used in setting the magnetization direction of reference layer(s) 110/110′/110″/110‴/140/160/140′/160′/140″/160″. Although a unidirectional current through the magnetic element 230′ is used, the additional current through the write line 208 may be into the page or out of the page in FIG. 13. As a result, direction of the magnetic field generated by the write line 208, which is used in setting the magnetization direction of the reference layer(s) 110/110′/110″/110‴/140/160/140′/160′/140″/160″, may differ depending upon the data desired to be written. Thus, the magnetic element 230′ may be written to the desired state using a unidirectional current from the bit line 202′ to the source line 206′ in addition to an additional current through the write line 208. Note that in an alternate embodiment, a unidirectional current from the source line 206′ or word line 204′ to the bit line 202′ might be used in connection with the additional current through the write line 208.

In order to read the magnetic memory cell 210′ an external magnetic fled may be generated by the bit line 202′ or the write line 208 or neighboring write lines (not shown). In one embodiment, the external magnetic field has the same direction for all read operations. A read operation is analogous to that described above for FIGS. 5A-11 and the magnetic elements 100/100′/100″/100‴/130/130′/130″. The read operation is, therefore, not further described. Thus state of the magnetic element 230′ an be determined.

Thus the magnetic memory cell 210 is written using a unidirectional current in conjunction with the external magnetic field. The external magnetic field used may be bidirectional and is used to select which of the states to which the magnetic element 230′ is written. Because the magnetic element 230′ may be written using a unidirectional currents the size of the storage cell 210′ may be smaller. Because of the use of the reference layer(s) 110/110′/110″/110‴/140/160/140′/160′/140″/160″ having the thermally unstable, resettable magnetizations, a lower current may be used to generate the external magnetic field. Thus, the magnetic element 230′ may be better able to be used in a high density memory.

Figure 14:
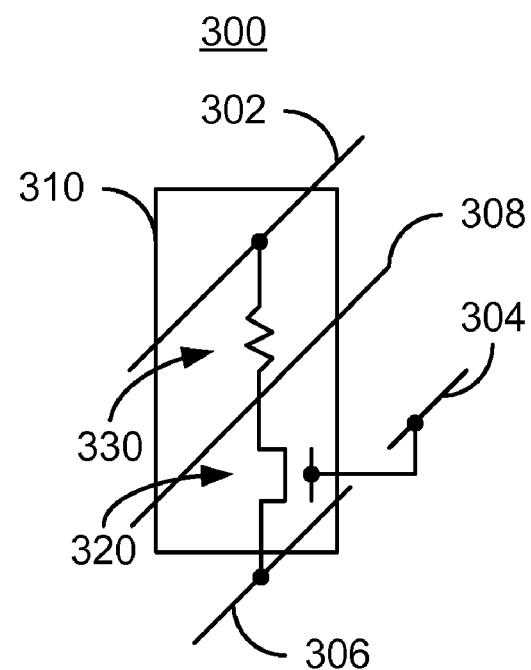
FIG. 14 is a diagram depicting an exemplary embodiment of a portion of a memory utilizing a magnetic element switchable with a unidirectional current.

FIG. 14 is a diagram depicting an exemplary embodiment of a portion of a memory 300 utilizing a magnetic element switchable with a unidirectional current. The magnetic memory 300 is analogous to the magnetic memory 200′ depicted in FIG. 13. Although particular memory cell 310 is shown, the magnetic memory 300 typically includes a number of magnetic memory cells 310 arranged in an array. The magnetic memory cell 310 includes a transistor 320 and a magnetic element 330. The magnetic element 330 might be any of the magnetic elements 100, 100′, 100″, 100‴, 130, 130′, and/or 130″. Thus, the magnetic element 330 may include reference layer(s) 110/110′/110″/110‴/140/160/140′/160′/140″/160″. Although only one transistor 320 is shown, another number may be included. The transistor 320 may used to select and/or isolate the memory cell 310. However, in another embodiment, other selection/isolation device/devices may be used. The transistor 320 may be an NMOS device. In another embodiment, however, a PMOS device may be used. Also shown are a bit line 302, word line 304, source line 306, and write line 308. Source line 306 might also be perpendicular to bit line 302 to form a cross point memory array cell.

In order to write to the magnetic element 330, a current is driven through the bit line 304 to the source line 306. An additional current is driven through the write line 308. The additional current, which might also be termed an assist current, generates the magnetic field used in setting the magnetization direction of reference layer(s) 110/110′/110″/110‴/140/160/140′/160′/140″/160″. Although a unidirectional current through the magnetic element 330 is used, the additional current through the write line 208 may be into the page or out of the page in FIG. 14. As a result, the magnetic field on the reference layer(s) 110/110′/110″/110‴/140/160/140′/160′/140″/160″ may differ depending upon the data desired to be written. Thus, the magnetic element 330 may be written to the desired state using a unidirectional current from the bit line 302 to the source line 306 in conjunction with an additional current through the write line 308. Note that in an alternate embodiment, a unidirectional current from the source line 306 or word line 304 to the bit line 302 might be used in conjunction with the additional current through the write line 308.

In order to read the magnetic memory cell 310, an external magnetic field may be generated by the bit line 302 or by the write line 308. In one embodiment, the external magnetic field has the same direction for all read operations. A read operation is analogous to that described above for FIGS. 5A-11 and the magnetic elements 100/100′/100″/100‴/130/130′/130″. The read operation is, therefore, not further described. Thus, state of the magnetic element 330 can be determined.

Thus, the magnetic memory cell 310 is written using a unidirectional current in conjunction with the external magnetic field. The external magnetic field used may be bidirectional and is used to select which of the states to which the magnetic element 330 is written. Because the magnetic element 330 may be written using a unidirectional current, the size of the storage cell 310 may be smaller. Because of the use of the reference layer(s) 110/110′/110″/110‴/140/160/140′/160′/140″/160″ having the thermally unstable, resettable magnetizations, a lower current may be used to generate the external magnetic field. Thus, the magnetic element 330 may be better able to be used in a high density memory.

Figure 15:
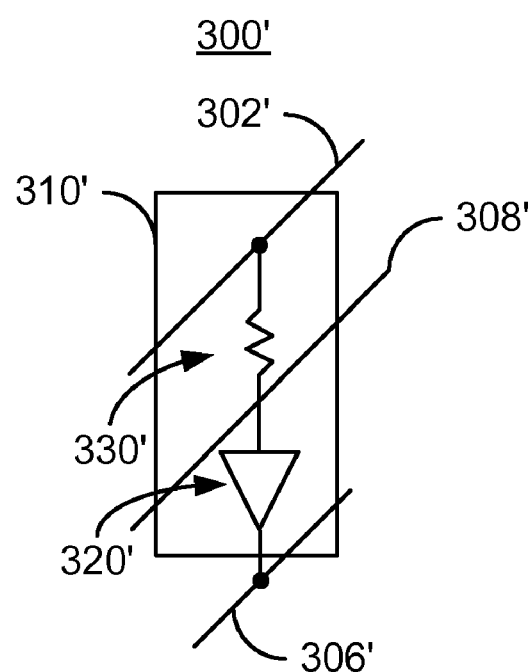
FIG. 15 is a diagram depicting an exemplary embodiment of a portion of a memory utilizing a magnetic element switchable with a unidirectional current.

FIG. 15 is a diagram depicting an exemplary embodiment of a portion of a memory 300′ utilizing a magnetic element switchable with a unidirectional current. The magnetic memory 300′ is analogous to the magnetic memory 300. Consequently, analogous components have similar labels. The magnetic memory 300 thus includes a magnetic memory cell 310′ including a selection device 320′ and a magnetic element 330′. Also shown are bit line 302′, source line 306′, and write line 308′. Although particular memory cell 310′ is shown, the magnetic memory 300′ typically includes a number of magnetic memory cells 310′ arranged in an array. The magnetic element 330′ might be any of the magnetic elements 100, 100', 100'', 100''', 130, 130', and/or 130''. Thus, the magnetic element 330' may include reference layer(s) 110/110'/110''/110'''/140/160/140'/160'/140''/160''. Although only one selection/isolation device 320' is shown, another number may be included. In the embodiment shown, the selection/isolation device 320' is a diode instead of a transistor. Source line 306' may also be perpendicular to bit line 302' to form a cross point memory array cell.

The magnetic memory 300' functions in an analogous manner to the memory 300. Thus, the magnetic memory cell 310 is written using a unidirectional current in conjunction with the external magnetic field. The external magnetic field used may be bidirectional and is used to select which of the states to which the magnetic element 330' is written. Because the magnetic element 330' may be written using a unidirectional current, the size of the storage cell 310' may be smaller. Because of the use of the reference layer(s) 110/110'/110''/110'''/140/160/140'/160'/140''/160'' having the thermally unstable, resettable magnetizations, a lower current may be used to generate the external magnetic field. Thus, the magnetic element 330' may be better able to be used in a high density memory.

Figure 16:
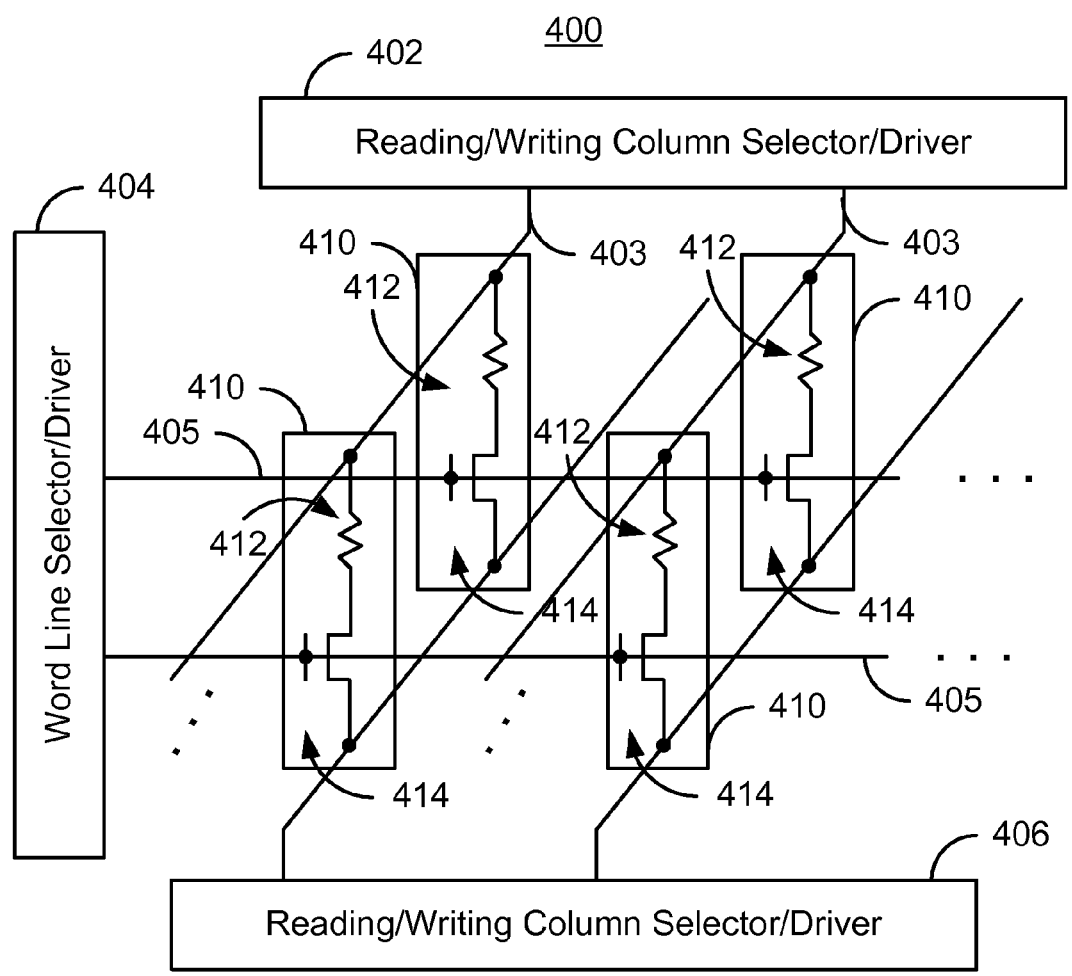
FIG. 16 is a diagram depicting an exemplary embodiment of a portion of a memory utilizing a magnetic element switchable with a unidirectional current.

FIG. 16 is a diagram depicting an exemplary embodiment of a portion of a memory 400 utilizing a magnetic element switchable with a unidirectional current. The magnetic memory 400 includes reading/writing column selector/drivers 402 and 406 as well as word line selector/driver 404. The magnetic memory 400 also includes memory cells 410 including a magnetic element 412 and a selection/isolation device 414. The magnetic element 412 may be any magnetic elements 100/100'/100''/100'''/130/130'/130''/230/230'. The reading/writing column selector/drivers 402 and 406 may be used to selectively drive current through the bit lines 403 and thus the cells 410. The word line selector/driver 104 selectively enables row(s) of the magnetic 400 by enabling the selection/isolation device 414 coupled with the selected word line 405. In the embodiment shown, the additional magnetic field used in writing may be provided by the bit lines 403. Thus, the magnetic memory 400 would be analogous to the magnetic memory 200 depicted in FIG. 12. However, in another embodiment, write lines (not shown) analogous to the write lines 208, 308, and/or 308' may be provided.

The magnetic memory 400 functions in an analogous manner to the memories 200, 200', 300, and/or 300'. Thus, the magnetic memory cell 410 is written using a unidirectional current in conjunction with the external magnetic field. The external magnetic field used may be bidirectional and is used to select which of the states to which the magnetic element 412 is written. Because the magnetic element 412 may be written using a unidirectional current, the size of the storage cell 410 may be smaller. Because of the use of the reference layer(s) 110/110'/110''/110'''/140/160/140'/160'/140''/160'' having the thermally unstable, resettable magnetizations, a lower current may be used to generate the external magnetic field. Thus, the magnetic element 412 may be better able to be used in a high density memory.

Figure 17:
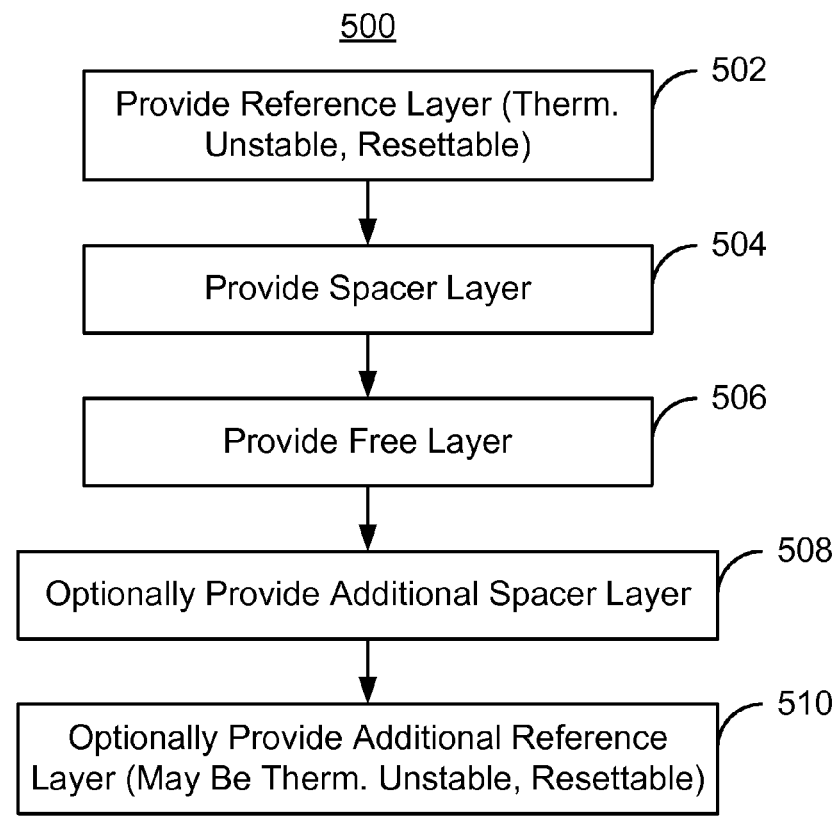
FIG. 17 is a diagram depicting an exemplary embodiment of a method for making a magnetic element switchable with a unidirectional current.

FIG. 17 is a diagram depicting an exemplary embodiment of a method 500 for making a magnetic element 100/100'/100''/100'''/130/130'/130'' switchable with a unidirectional current. Although the method 500 is described in the context of particular steps having a particular order, in another embodiment, steps may be combined and/or carried out in another order. In addition, individual steps may include one or more sub-steps. Further, for clarity, the method 500 is described in the context of the magnetic elements 100/100'/100''/100'''/130/130'/130''.

A reference layer 110/110'/110''/110'''/140/140'/140'' having a resettable magnetization is provided, via step 502. In one embodiment, step 502 includes providing a reference layer 110/110'/110''/110'''/140/140'/140'' that is magnetically thermally unstable at room temperature. For example, the reference layer 110/110'/110''/110'''/140/140'/140'' may be and/or include a superparamagnetic layer. In addition, the reference layer 110/110'/110''/110'''/140/140'/140'' has a coercivity of not more than twenty Oe. The magnetization of the reference layer 110/110'/110''/110'''/140/140'140'' may thus be set in a selected direction by a magnetic field generated externally to the reference layer 110/110'/110''/110'''/140/140'/140'' during use. Further, the reference layer 110/110'/110''/110'''/140/140'/140'' may be synthetic or simple.

A spacer layer 118/118'/118''/118'''/148/148'/148'' is provided, via step 504. The spacer layer 118/118'/118''/118'''/148/148'/148'' is nonferromagnetic. In one embodiment, the spacer layer 118/118'/118''/118'''/148/148'/148'' is conductive. In another embodiment, step 504 may include providing a spacer layer 118/118'/118''/118'''/148/148'/148'' that is an insulating tunneling barrier. In yet another embodiment, the spacer layer 118/118'/118''/118'''/148/148'/148'' might have another structure, such as a granular layer.

A free layer 120/120'/120''/120'''/150/150'/150'' is provided on the spacer layer 118/118'/118''/118'''/148/148'/148'', via step 506. Step 506 may include providing a simple or synthetic free layer 120/120'/120''/120'''/150/150'/150''. Further, it is noted that part of performing at least step 506 includes the magnetic element 100/100'/100''/100'''/130/130'/130'' being configured to allow the free layer 120/120'/120''/120'''/150/150'/150'' to be switched when a write current is passed through the magnetic element 100/100'/100''/100'''/130/130'/130''.

An additional spacer layer 158/158'/158'' may optionally be provided on the free layer 150/150'/150'', via step 508. A spacer layer 118/118'/118''/118'''/148/148'/148'' is provided, via step 504. The spacer layer 158/158'/158'' is nonferromagnetic. In one embodiment, the spacer layer 158/158'/158'' is conductive. In another embodiment, step 508 may include providing a spacer layer 158/158'/158'' that is an insulating tunneling barrier. In yet another embodiment, the spacer layer 158/158'/158'' might have another structure, such as a granular layer.

An additional reference layer 160/160'/160'' may optionally be provided on the additional spacer layer 158/158'/158'', via step 510. In one embodiment, step 510 includes providing a reference layer 160/160'/160'' that is magnetically thermally unstable at room temperature. For example, the reference layer 160/160'/160'' may be and/or include a superparamagnetic layer. In addition, the reference layer 160/160'/160'' has a coercivity of not more than twenty Oe. The magnetization of the reference layer 160/160'/160'' may thus be set in a selected direction by a magnetic field generated externally to the reference layer 160/160'/160'' during use. Further, the reference layer 160/160'/160'' may be synthetic or simple. Fabrication of the magnetic element 100/100'/100''/100'''/130/130'/130'' may be completed. For example, capping layer(s) and other structure(s) for the memories 200/200'/300/300'/400 may be provided.

Using the method 500, therefore, the magnetic elements 100/100'/100''/100'''/130/130'/130'' may be provided. The magnetic elements 100/100'/100''/100'''/130/130'/130'' are written using a unidirectional current in conjunction with the external magnetic field. Consequently, the benefit, of the magnetic elements 100/100'/100''/100'''/130/130'/130'' may be achieved.

Figure 18:
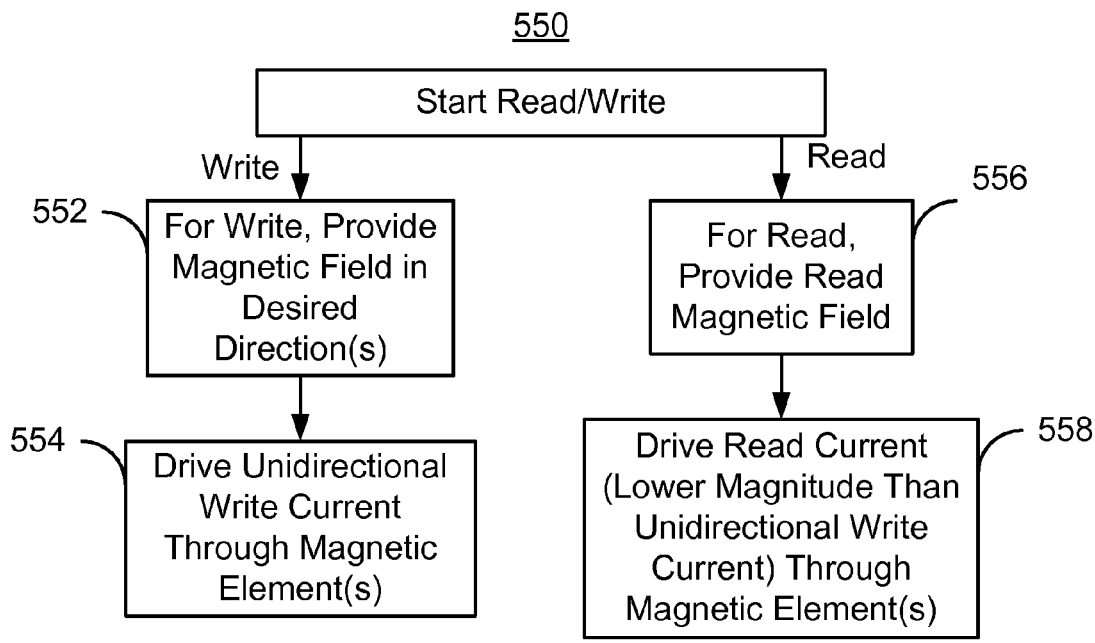
FIG. 18 is a diagram depicting an exemplary embodiment of a method for using a magnetic element switchable with a unidirectional current.

FIG. 18 is a diagram depicting an exemplary embodiment of a method 550 for using a magnetic element switchable with a unidirectional current. Although the method 550 is described in the context of particular steps having a particular order, in another embodiment, steps may be combined and/or carried out in another order. In addition, individual steps may include one or more sub-steps. Further, for clarity, the method 550 is described in the context of the magnetic elements 100/100'/100"/100'''/130/130'/130".

For a write operation. If a portion of the plurality of storage cells is to be written, a magnetic field corresponding to the desired direction is generated at least at the reference layer(s) 110/110'/110"/110'''/140/140'/140"/160/160'/160" of the magnetic element(s) 100/100'/100"/100'''/130/130'/130" to be written, via step 552. In one embodiment, step 552 is performed by driving a current through a bit line in a particular direction. The bit line also carries the current that is to be provided through the magnetic element 100/100'/100"/100'''/130/130'/130" in step 554, below. In another embodiment the magnetic field is generated by an additional write line. In one embodiment, the write magnetic field may last longer than the unidirectional write current.

A unidirectional write current is provided through the magnetic element(s) 100/100'/100"/100'''/130/130'/130" to be written, via step 554. In one embodiment, the unidirectional write current is provided by the same line as carries the additional current for generating the magnetic field. However, in another embodiment, the unidirectional write current and additional current for generating the magnetic field are provided by different lines. Thus, the state(s) of the magnetic element(s) 100/100'/100"/100'''/130/130'/130" are determined by the unidirectional write current and the resettable magnetization;

If the magnetic storage cells are to be read, a read magnetic field is generated externally to the reference layer(s) 110/110'/110"/110'''/140/140'/140"/160/160'/160" for the magnetic storage cells, via step 556. In one embodiment, the read magnetic field has a particular direction independent of the state of the one magnetic element(s) 100/100'/100"/100'''/130/130'/130". In one embodiment, the read magnetic field is provided by the read current or a current flowing in the bit line, described below. Thus, in one embodiment, the bit line is used to provide the read current in step 556. In another embodiment, another line may be used.

A read current less than the unidirectional (write) current is provided through the magnetic element(s) 100/100'/100"/100'''/130/130'/130" to be read, via step 558. As a result, the read current does not alter the state(s) of the magnetic element(s) 100/100'/100"/100'''/130/130'/130" being read. In one embodiment, the magnetic field may last longer than the read current.

Using the method 550, therefore, the magnetic elements 100/100'/100"/100'''/130/130'/130" may be used. The magnetic elements 100/100'/100"/100'''/130/130'/130" are written using a unidirectional current in conjunction with the external magnetic field. Similarly, the magnetic elements 100/100'/100"/100'''/130/130'/130" may be read using a magnetic field in conjunction with a read current. Consequently, the benefits of the magnetic elements 100/100'/100"/100'''/130/130'/130" may be achieved.

A method and system for providing a magnetic memory element and memory fabricated using the magnetic memory element has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element comprising:
   a reference layer having a resettable magnetization, the resettable magnetization being set in a selected direction by a magnetic field generated externally to the reference layer, the reference layer being magnetically thermally unstable at an operating temperature and have $K_uV/k_BT$ less than fifty five;
   a spacer layer, the spacer layer being nonferromagnetic; and
   a free layer, the spacer layer residing between the reference layer and the free layer;
   wherein the magnetic element is configured to allow the free layer to be switched to each of a plurality of states when a write current is passed through the magnetic element.

2. The magnetic element of claim 1 wherein at least one of the reference layer includes a superparamagnetic layer and the reference layer having a coercivity of not more than twenty Oe.

3. The magnetic element of claim 2 wherein the superparamagnetic layer has the coercivity of less than twenty Oe.

4. The magnetic element of claim 1 wherein the free layer is a synthetic free layer including at least a first ferromagnetic layer, a second ferromagnetic layer, and a nonmagnetic spacer layer between the first ferromagnetic layer and the second ferromagnetic layer.

5. The magnetic element of claim 1 wherein the spacer layer is an insulating barrier layer.

6. The magnetic element of claim 1 wherein the reference layer is a synthetic reference layer including at least a first magnetic layer, a second magnetic layer, and a nonmagnetic spacer layer between the first magnetic layer and the second magnetic layer, at least one of the first magnetic layer and the second magnetic layer being a superparamagnetic layer.

7. The magnetic element of claim 1 further comprising:
   a bias layer adjacent to the free layer, the bias layer for stabilizing the free layer.

8. The magnetic element of claim 1 further comprising:
   an additional spacer layer; and
   an additional reference layer, the free layer residing between the spacer layer and the additional spacer layer, the additional spacer layer residing between the additional reference layer and the free layer.

9. The magnetic element of claim 8 wherein the additional reference layer has an additional resettable magnetization, the additional resettable magnetization being set in an additional selected direction by a magnetic field generated externally to the additional reference layer, the additional reference layer being magnetically thermally unstable and having an additional $K_uV/k_BT$ less than fifty five.

10. The magnetic element of claim 9 wherein at least one of the additional reference layer includes a superparamagnetic layer and the additional reference layer has the additional resettable magnetization set in the selected layer by the magnetic field of not more than twenty Oersted.

11. The magnetic element of claim 9 wherein the additional selected direction is the same as the selected direction.

12. The magnetic element of claim 9 wherein the spacer layer has a first resistance area product, the additional spacer layer has a second resistance area product and wherein at least one of the first resistance area product is greater than the second resistance area product and the second resistance area product is greater than the first resistance area product.

13. The magnetic element of claim 1 wherein the free layer has a free layer damping constant and the reference layer has a reference layer damping constant greater than the free layer damping constant.

14. The magnetic element of claim 1 wherein the free layer is thermally stable.

15. A magnetic memory comprising:
a plurality of magnetic storage cells, each of the plurality of magnetic storage cells including at least one magnetic element, each of the at least one magnetic element include a reference layer, a spacer layer, and a free layer, the reference layer having a resettable magnetization, the resettable magnetization being set in a selected direction by a magnetic field generated externally to the reference layer, the reference layer being magnetically thermally unstable at an operating temperature and have a $K_u V/k_B T$ less than fifty five, the spacer layer being nonferromagnetic, the spacer layer residing between the reference layer and the free layer, the magnetic element being configured to allow the free layer to be switched to each of a plurality of states when a write current is passed through the magnetic element;
a plurality of word lines coupled with the plurality of magnetic storage cells; and
a plurality of bit lines coupled with the plurality of storage cells.

16. The magnetic memory of claim 15 wherein at least one of the reference layer includes a superparamagnetic layer and the reference layer has a coercivity of not more than twenty Oe.

17. The magnetic memory of claim 15 wherein the reference layer is a synthetic reference layer including at least a first magnetic layer, a second magnetic layer, and a nonmagnetic spacer layer between the first magnetic layer and the second magnetic layer, at least one of the first magnetic layer and the second magnetic layer being a superparamagnetic layer.

18. The magnetic memory of claim 15 wherein the at least one magnetic element further includes:
an additional spacer layer; and
an additional reference layer, the free layer residing between the spacer layer and the additional spacer layer, the additional spacer layer residing between the additional reference layer and the free layer.

19. The magnetic memory of claim 18 wherein the additional reference layer has an additional resettable magnetization, the additional resettable magnetization being set in an additional selected direction by the magnetic field generated externally to the additional reference layer, the additional reference layer being magnetically thermally unstable at memory operating temperature range ($K_u V/k_B T$ is less than fifty five).

20. The magnetic memory of claim 19 wherein at least one of the additional reference layer being an additional superparamagnetic layer and the additional reference layer having a coercivity of not more than twenty Oersted.

21. The magnetic memory of claim 19 wherein the spacer layer has a first resistance area product, the additional spacer layer has a second resistance area product and wherein at least one of the first resistance area product is greater than the second resistance area product and the second resistance area product is greater than the first resistance area product.

22. The magnetic memory of claim 16 wherein each of the plurality of magnetic storage cells further includes:
at least one transistor coupled to the magnetic element.

23. The magnetic memory of claim 22 wherein the at least one transistor is a single transistor.

24. The magnetic memory of claim 22 wherein the at least one transistors is at least two transistors.

25. The magnetic memory of claim 15 wherein the plurality of bit lines are configured to provide the magnetic field for setting the resettable magnetization.

26. The magnetic memory of claim 15 further comprising:
a plurality of write lines configured to generate the magnetic field for setting the resettable magnetization.

27. The magnetic memory of claim 15 wherein the free layer has a free layer damping constant and the reference layer has a reference layer damping constant greater than the free layer damping constant.

28. The memory of claim 15 wherein the free layer is thermally stable.

29. A method for using a magnetic memory, the magnetic memory including a plurality of storage cells, a plurality of bit lines coupled to the plurality of storage cells, and a plurality of word lines coupled to the plurality of storage cells, each of the plurality of storage cells including at least one magnetic element, the method comprising:
If a portion of the plurality of storage cells is to be written, generating a magnetic field, each of the at least one magnetic element include a reference layer, a spacer layer, and a free layer, the magnetic field being generated externally to the reference layer, the reference layer having a resettable magnetization, the resettable magnetization being set in a selected direction of a plurality of directions by the magnetic field, the reference layer including a layer that is magnetically thermally unstable and having $K_u V/k_B T$ is less than fifty five at an operating temperature, the layer being at least one of a superparamagnetic layer and having a low coercivity layer having a coercivity of not more than twenty Oe, the spacer layer being nonferromagnetic and residing between the reference layer and the free layer, the magnetic element being configured to allow the free layer to be switched to each of a plurality of states when a write current is passed through the magnetic element;
providing a unidirectional write current through the at least one magnetic element of the portion of the plurality of magnetic storage cells If the portion of the plurality of storage cells is to be written, a state of the at least one magnetic element being determined by the unidirectional write current and the resettable magnetization;
if the portion of the plurality of magnetic storage cells is to be read, generating a read magnetic field externally to the reference layer for the portion of the plurality of magnetic storage cells, the read magnetic field having a particular direction independent of the state of the at least one magnetic element; and
providing a read current less than the write current through the at least one magnetic element of the portion of the plurality of magnetic storage cells If the portion of the plurality of storage cells is to be read.

30. The method of claim 29 wherein the free layer is thermally stable.

* * * * *